US011698479B2

(12) United States Patent
Takishita et al.

(10) Patent No.: US 11,698,479 B2
(45) Date of Patent: Jul. 11, 2023

(54) STRUCTURE, SOLID IMAGE PICKUP ELEMENT, INFRARED SENSOR, AND COMPOSITION

(71) Applicant: FUJIFILM Corporation, Tokyo (JP)

(72) Inventors: Hirotaka Takishita, Haibara-gun (JP); Yutaro Fukami, Haibara-gun (JP); Kyohei Arayama, Haibara-gun (JP); Hiroaki Idei, Haibara-gun (JP); Michihiro Ogawa, Haibara-gun (JP); Yushi Kaneko, Haibara-gun (JP); Shunsuke Kitajima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 791 days.

(21) Appl. No.: 16/385,531

(22) Filed: Apr. 16, 2019

(65) Prior Publication Data

US 2019/0243039 A1 Aug. 8, 2019

Related U.S. Application Data

(63) Continuation of application No. PCT/JP2017/039719, filed on Nov. 2, 2017.

(30) Foreign Application Priority Data

Nov. 18, 2016 (JP) .................................. 2016-224928
Oct. 27, 2017 (JP) .................................. 2017-207759

(51) Int. Cl.
*G02B 5/22* (2006.01)
*H01L 31/0216* (2014.01)
(Continued)

(52) U.S. Cl.
CPC ................. *G02B 5/22* (2013.01); *G02B 3/00* (2013.01); *G02B 5/20* (2013.01); *H01L 31/0232* (2013.01); *H01L 31/02164* (2013.01)

(58) Field of Classification Search
CPC .......... H01L 31/0232; H01L 31/02164; G02B 5/208; G02B 5/22; G02B 3/0068; G02B 3/0062
See application file for complete search history.

(56) References Cited

U.S. PATENT DOCUMENTS

| 2008/0038665 | A1* | 2/2008 | Ober | G03F 7/0382 |
| | | | | 430/269 |
| 2012/0104435 | A1* | 5/2012 | Lee | H01L 33/54 |
| | | | | 257/E33.061 |

(Continued)

FOREIGN PATENT DOCUMENTS

| CN | 102719148 A | 10/2012 |
| CN | 104884537 A | 9/2015 |

(Continued)

OTHER PUBLICATIONS

Chinese Office Action and Search Report for corresponding Chinese Application No. 201780065961.2, dated Jan. 27, 2022, with English translation.

(Continued)

*Primary Examiner* — Reema Patel
(74) *Attorney, Agent, or Firm* — Birch, Stewart, Kolasch & Birch, LLP

(57) ABSTRACT

A structure includes: a near infrared transmitting filter that shields light in a visible range and allows transmission of at least a part of light in a near infrared range; and a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range.

13 Claims, 2 Drawing Sheets

(51) Int. Cl.
H01L 31/0232 (2014.01)
G02B 3/00 (2006.01)
G02B 5/20 (2006.01)
H01L 31/00 (2006.01)

(56) References Cited

U.S. PATENT DOCUMENTS

| | | | |
|---|---|---|---|
| 2015/0277002 A1 | 10/2015 | Ezoe et al. | |
| 2015/0378089 A1 | 12/2015 | Oba et al. | |
| 2017/0023858 A1* | 1/2017 | Takishita | .......... H01L 27/14649 |

FOREIGN PATENT DOCUMENTS

| | | | | |
|---|---|---|---|---|
| CN | 105278157 A | | 1/2016 | |
| JP | 2003-171680 A | | 6/2003 | |
| JP | 2004-198617 A | | 7/2004 | |
| JP | 2005-266538 A | | 9/2005 | |
| JP | 2006-351788 A | | 12/2006 | |
| JP | 2008-502938 A | | 1/2008 | |
| JP | 2008-185683 A | | 8/2008 | |
| JP | 2011-211000 A | | 10/2011 | |
| JP | 2013-50593 A | | 3/2013 | |
| JP | 2004198617 | * | 7/2015 | ............... B32B 7/02 |
| WO | WO 2015/182278 A1 | | 12/2015 | |
| WO | WO 2017/110939 A1 | | 6/2017 | |
| WO | WO-2017110939 A1 | * | 6/2017 | ............... G02B 5/22 |

OTHER PUBLICATIONS

Japanese Office Action for corresponding Japanese Application No. 2018-551569, dated May 19, 2020, with English translation.
Chinese Office Action for corresponding Chinese Application No. 201780065961.2, dated Jun. 3, 2021, with an English translation.
Japanese Office Action, dated Dec. 8, 2020, for corresponding Japanese Application No. 2018-551569, with an English translation.
Chinese Office Action and Search Report for corresponding Chinese Application No. 201780065961.2, dated Oct. 10, 2020, with an English translation.
Taiwanese Office Action and Search Report, dated Nov. 26, 2020, for corresponding Taiwanese Application No. 106139378 with an English translation of the Taiwanese Office Action.
International Preliminary Report on Patentability and Written Opinion of the International Searching Authority (Forms PCT/IB/326, PCT/IB/373, and PCT/ISA/237) for International Application No. PCT/JP2017/039719, dated May 31, 2019, with English translation.
International Search Report (Form PCT/ISA/210) for International Application No. PCT/JP2017/039719, dated Jan. 16, 2018, with English translation.

* cited by examiner

STRUCTURE, SOLID IMAGE PICKUP ELEMENT, INFRARED SENSOR, AND COMPOSITION

CROSS-REFERENCE TO RELATED APPLICATIONS

This application is a Continuation of PCT International Application No. PCT/JP2017/039719, filed on Nov. 2, 2017, which claims priority under 35 U.S.C. § 119(a) to Japanese Patent Application No. 2016-224928, filed on Nov. 18, 2016 and Japanese Patent Application No. 2017-207759, filed on Oct. 27, 2017. Each of the above application(s) is hereby expressly incorporated by reference, in its entirety, into the present application.

BACKGROUND OF THE INVENTION

1. Field of the Invention

The present invention relates to a structure including a near infrared transmitting filter, a solid image pickup element, and an infrared sensor. In addition, the present invention relates to a composition used for forming the above-described structure.

2. Description of the Related Art

In the relates art, in a solid image pickup element such as a charge coupled device (CCD) image sensor, for example, an attempt to obtain a color image using a color filter has been made. In addition, a microlens or an optical waveguide is provided on an optical path of each color filter to improve the sensitivity of a pixel in the color filter (for example, refer to JP2011-211000A and JP2006-351788A).

As a material for forming a microlens or an optical waveguide, a material that is transparent and has a high refractive index is used. As this material, for example, titanium dioxide, silicon dioxide, zirconia, or alumina is used. In addition, JP2008-185683A describes that a microlens or the like is manufactured using a composition including a metal oxide selected from the group consisting of titania, alumina, and zirconia as a major component and including particles with surfaces in which silicon dioxide is present.

On the other hand, recently, the use of a solid image pickup element as an infrared sensor can also be considered. For example, near infrared light is less likely to be scattered than visible light due to its longer wavelength and can be used in, for example, distance measurement or three-dimensional measurement. In addition, near infrared light is invisible to persons or animals. Therefore, even in a case where a subject is irradiated with near infrared light at night, the subject cannot recognize the near infrared light. Thus, near infrared light can be used for imaging a nocturnal wild animal or imaging a subject without provoking the subject for a security reason. This way, a sensor (infrared sensor) that detects near infrared light can be used in various applications.

SUMMARY OF THE INVENTION

As an infrared sensor, a near infrared transmitting filter that shields light in a visible range and allows transmission of at least a part of light in a near infrared range (hereinafter, also referred to as near infrared transmitting filter) is used. In this infrared sensor, light (near infrared light) transmitted through the near infrared transmitting filter is detected by a light receiving section of a solid image pickup element for various kinds of sensing. As one property required for the infrared sensor, further improvement of sensitivity to near infrared light is desired.

Accordingly, an object of the present invention is to provide a structure used for an infrared sensor that can perform high-sensitivity sensing using near infrared light, a solid image pickup element, and an infrared sensor. In addition, another object of the present invention is to provide a composition used for manufacturing the above-described structure.

The present inventors conducted an investigation on a member such as a microlens or an optical waveguide used to improve the sensitivity of a pixel in a color filter in the related art and found that this member has insufficient near infrared light collecting properties. The present inventors found that, by using a member having a high refractive index to near infrared light instead of the above-described member, the sensitivity of an infrared sensor to near infrared light can be further improved, thereby completing the present invention. Accordingly, the present invention provides the following.

<1> A structure comprising:

a near infrared transmitting filter that shields light in a visible range and allows transmission of at least a part of light in a near infrared range; and a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range.

<2> The structure according to <1>, in which the near infrared transmitting filter is a filter that allows transmission of at least a part of light in a wavelength range of 800 nm to 2000 nm.

<3> The structure according to <1> or <2>, in which the near infrared transmitting filter is a filter that allows transmission of at least light having a wavelength of 940 nm, and the member allows transmission of at least light having a wavelength of 940 nm and has a refractive index of 1.7 or higher for light having a wavelength of 940 nm.

<4> The structure according to <1> or <2>, in which the near infrared transmitting filter is a filter that allows transmission of at least light having a wavelength of 850 nm, and the member allows transmission of at least light having a wavelength of 850 nm and has a refractive index of 1.7 or higher for light having a wavelength of 850 nm.

<5> The structure according to <1> or <2>, in which the near infrared transmitting filter is a filter that allows transmission of at least light having a wavelength of 810 nm, and the member allows transmission of at least light having a wavelength of 810 nm and has a refractive index of 1.7 or higher for light having a wavelength of 810 nm.

<6> The structure according to any one of <1> to <5>, in which in the member, B/A which is a ratio of a maximum value B of an absorbance in a wavelength range of 400 nm or longer and shorter than 800 nm to a maximum value A of an absorbance in a wavelength range of 800 nm to 2000 nm is 1.0 or higher.

<7> The structure according to any one of <1> to <6>, in which the member has a lens shape and is provided on the incidence side of the near infrared transmitting filter.

<8> The structure according to any one of <1> to <7>, in which the member includes particles.

<9> The structure according to <8>, in which the particles are formed of a phthalocyanine compound.

<10> The structure according to any one of <1> to <9>, in which the member includes a resin.

<11> The structure according to any one of <1> to <10>, further comprising:
a color filter that includes a chromatic colorant.

<12> A solid image pickup element comprising:
the structure according to any one of <1> to <11>.

<13> An infrared sensor comprising:
the structure according to any one of <1> to <11>.

<14> A composition which is used for forming the member in the structure according to any one of <1> to <11>, the composition comprising:
at least one selected from a resin or particles,
in which in a case where a film having a thickness of 0.1 μm is formed using the composition, the film allows transmission of light in a near infrared range and has a refractive index of 1.7 or higher for the light in the near infrared range.

<15> The composition according to <14>, in which the particles are formed of a phthalocyanine compound.

<16> The composition according to <14> or <15>, in which a content of the particles is 0.01 to 80 mass % with respect to a total solid content of the composition.

According to the present invention, a structure used for an infrared sensor that can perform high-sensitivity sensing using near infrared light, a solid image pickup element, and an infrared sensor can be provided. In addition, a composition used for manufacturing the above-described structure can be provided.

DESCRIPTION OF THE PREFERRED EMBODIMENTS

Figure 1:
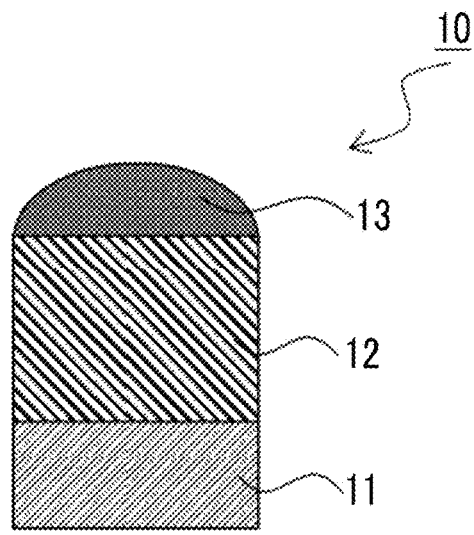
FIG. 1 is a schematic diagram illustrating a configuration of an embodiment of a structure according to the present invention.

In this specification, a total solid content denotes the total mass of components of a composition excluding a solvent.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)allyl" denotes either or both of allyl and methallyl, "(meth)acryl" denotes either or both of acryl and methacryl, and "(meth)acryloyl" denotes either or both of acryloyl and methacryloyl.

In this specification, the term "step" denotes not only an individual step but also a step which is not clearly distinguishable from another step as long as an effect expected from the step can be achieved.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HLC-8220 (manufactured by Tosoh Corporation) as a measuring device, using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

<Structure>

A structure according to an embodiment of the present invention comprises:

a near infrared transmitting filter that shields light in a visible range and allows transmission of at least a part of light in a near infrared range; and a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range.

In the structure according to the embodiment of the present invention, by providing the member (hereinafter, also referred to as "high refractive index member IR") on the optical path of the near infrared transmitting filter on at least one of the incidence side into the near infrared transmitting filter or the emission side from the near infrared transmitting filter, near infrared light collecting properties can be improved, and the sensitivity to near infrared light can be further improved. Therefore, for example, by incorporating the structure according to the embodiment of the present invention into a solid image pickup element or an infrared sensor, an infrared sensor capable of higher-accuracy sensing or the like can be obtained.

It is preferable that the structure according to the embodiment of the present invention is used for a solid image pickup element, an infrared sensor, or the like. Hereinafter, the details of the structure according to the embodiment of the present invention will be described.

<<Near Infrared Transmitting Filter>>

The structure according to the embodiment of the present invention includes a near infrared transmitting filter. In the present invention, the light (near infrared light) in the near infrared range whose transmission is allowed by the near infrared transmitting filter can be appropriately selected according to the use. The near infrared transmitting filter is preferably a filter that allows transmission of at least a part of light in a wavelength range of 800 nm to 2000 nm, more preferably a filter that allows transmission of at least a part of light in a wavelength range of 800 nm to 1500 nm, and still more preferably a filter that allows transmission of at least a part of light in a wavelength range of 800 nm to 1200 nm.

$A_{min}/B_{max}$, which is a ratio of a maximum value $B_{max}$ of an absorbance in a wavelength range of 1100 to 1300 nm to a minimum value $A_{min}$ of an absorbance in a wavelength range of 400 to 700 nm in the near infrared transmitting filter, is preferably 4.5 or higher, more preferably 7.5 or higher, still more preferably 15 or higher, and even still more preferably 30 or higher. According to this aspect, light in a visible range (hereinafter, also referred to as "visible light") can be shielded, and transmission of near infrared light in a specific wavelength range can be allowed.

Examples of the near infrared transmitting filter include the following aspects (1) to (4).

(1): an aspect in which a maximum value of a light transmittance of the film in a thickness direction in a wavelength range of 400 to 700 nm is 20% or lower (preferably 15% or lower and more preferably 10% or lower), and a minimum value of a light transmittance of the film in the thickness direction in a wavelength range of 930 to 950 nm is 50% or higher (preferably 70% or higher and more preferably 80% or higher). According to this aspect, a filter that can allow transmission of at least near infrared light having a wavelength of 940 nm in a state where noise generated from visible light is small can be obtained.

(2): an aspect in which a maximum value of a light transmittance of the film in a thickness direction in a wavelength range of 400 to 700 nm is 20% or lower (preferably 15% or lower and more preferably 10% or lower), and a minimum value of a light transmittance of the film in the thickness direction in a wavelength range of 840 to 860 nm is 50% or higher (preferably 70% or higher and more preferably 80% or higher). According to this aspect, a filter that can allow transmission of at least near infrared light having a wavelength of 850 nm in a state where noise generated from visible light is small can be obtained.

(3): an aspect in which a maximum value of a light transmittance of the film in a thickness direction in a wavelength range of 400 to 700 nm is 20% or lower (preferably 15% or lower and more preferably 10% or lower), and a minimum value of a light transmittance of the film in the thickness direction in a wavelength range of 800 to 820 nm is 50% or higher (preferably 70% or higher and more preferably 80% or higher). According to this aspect, a filter that can allow transmission of at least near infrared light having a wavelength of 810 nm in a state where noise generated from visible light is small can be obtained.

(4): an aspect in which a maximum value of a light transmittance of the film in a thickness direction in a wavelength range of 400 to 700 nm is 20% or lower (preferably 15% or lower and more preferably 10% or lower), and a minimum value of a light transmittance of the film in the thickness direction in a wavelength range of higher than 820 nm and lower than 840 nm is 50% or higher (preferably 70% or higher and more preferably 80% or higher). According to this aspect, a filter that can allow transmission of at least near infrared light having a wavelength of 830 nm in a state where noise generated from visible light is small can be obtained.

The near infrared transmitting filter may be configured as one-layer film (single-layer film) or as a laminate (multi-layer film) including two or more films. In addition, in a case where the near infrared transmitting filter is configured as a multi-layer film, the multi-layer film as a whole may have the above-described spectral characteristics or each of the single-layer films may not have the above-described spectral characteristics.

The near infrared transmitting filter can be formed using, for example, a composition (composition for forming a near infrared transmitting filter) including a coloring material that allows transmission of near infrared light and shields visible light (hereinafter, also referred to as "coloring material that shields visible light"). For example, the composition for forming a near infrared transmitting filter can be applied and cured to manufacture the near infrared transmitting filter. The near infrared transmitting filter may be a film having a pattern or a film not having a pattern. Examples of a method of forming a pattern include a photolithography method and a dry etching method.

It is preferable that the coloring material that shields visible light is a coloring material that shields light in a wavelength range of 400 to 700 nm. It is preferable that the coloring material that shields visible light satisfies at least one of the following requirement (1) or (2).

(1): The coloring material that shields visible light includes two or more chromatic colorants, and a combination of the two or more chromatic colorants forms black.

(2): The coloring material that shields visible light includes an organic black colorant. According to this aspect, it is preferable that the coloring material that shields visible light further includes a chromatic colorant.

In the present invention, the chromatic colorant denotes a colorant other than a white colorant and a black colorant. It is preferable that the chromatic colorant is a colorant having an absorption maximum in a wavelength range of 400 to 700 nm. In addition, in the present invention, the organic black colorant as the coloring material that shields visible light denotes a material that absorbs visible light and allows transmission of at least a part of infrared light. Accordingly, in the present invention, the organic black colorant as the coloring material that shields visible light does not denote a black colorant that absorbs both visible light and infrared light, for example, carbon black or titanium black. It is preferable that the organic black colorant is a colorant having an absorption maximum in a wavelength range of 400 to 700 nm.

It is preferable that the coloring material that shields visible light is a material in which a ratio A1/B1 of a maximum value A1 of an absorbance in a wavelength range of 400 to 700 nm to a minimum value B1 of an absorbance in a wavelength range of 900 to 1300 nm is 4.5 or higher. In addition, it is preferable that the coloring material that shields visible light is a coloring material that allows transmission of at least a part of light in a wavelength range of 800 to 2000 nm. The above-described characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

In the present invention, the chromatic colorant is selected from the group consisting of a red colorant, a green colorant, a blue colorant, a yellow colorant, a violet colorant, and an orange colorant. As the chromatic colorant, a pigment or a dye may be used. It is preferable that the chromatic colorant is a pigment. As the pigment, an organic pigment is preferable. Examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

In addition, as the yellow pigment, a metal azo pigment including at least one anion selected from an azo compound represented by the following Formula (I) or an azo compound having a tautomeric structure of the azo compound represented by Formula (I), two or more metal ions, and a melamine compound can be used.

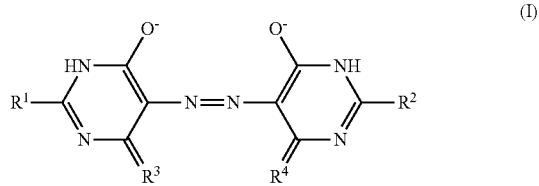

(I)

In the formula, $R^1$ and $R^2$ each independently represent OH or $NR^5R^6$, $R^3$ and $R^4$ each independently represent =O or =$NR^7$, and $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include a substituent T described below. In particular, a halogen atom, a hydroxyl group, an alkoxy group, a cyano group, or an amino group is preferable.

In Formula (I), it is preferable that $R^1$ and $R^2$ represent OH. In addition, it is preferable that $R^3$ and $R^4$ represent O.

It is preferable that the melamine compound in the metal azo pigment is a compound represented by the following Formula (II).

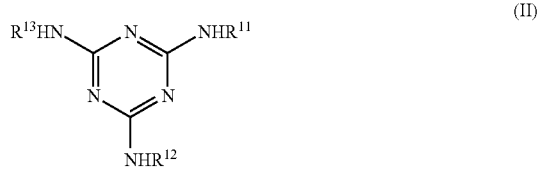

(II)

In the formula, $R^{11}$ to $R^{13}$ each independently represent a hydrogen atom or an alkyl group. The number of carbon atoms in the alkyl group is preferably 1 to 10, more preferably 1 to 6, and still more preferably 1 to 4. The alkyl group may be linear, branched, or cyclic and is preferably linear or branched and more preferably linear. The alkyl group may have a substituent. Examples of the substituent include the substituent T described below. In particular, a hydroxyl group is preferable. It is preferable that at least one of $R^{11}$, $R^{12}$, or $R^{13}$ represents a hydrogen atom, and it is more preferable that all of $R^{11}$ to $R^{13}$ represent a hydrogen atom.

In the metal azo pigment, the content of the melamine compound (preferably the compound represented by Formula (II)) is 0.05 to 4 mol, more preferably 0.5 to 2.5 mol, and still more preferably 1.0 to 2.0 mol with respect to 1 mol of at least one anion selected from an azo compound represented by Formula (I) or an azo compound having a tautomeric structure of the azo compound represented by Formula (I).

The specific surface area of the metal azo pigment is preferably 20 to 200 $m^2/g$. The lower limit is preferably 60 $m^2/g$ or more and more preferably 90 $m^2/g$ or more. The upper limit is preferably 160 $m^2/g$ or less and more preferably 150 $m^2/g$ or less. The value of the specific surface area of the metal azo pigment in this specification refers to a value measured using a BET (Brunauer, Emmett, and Teller) method according to DIN 66131:determination of the specific surface area of solids by gas adsorption.

(Substituent T)

Examples of the above-described substituent T include the following groups: an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), a heteroaryloxycarbonyl group, an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxyl group, a carboxyl group, a sulfo group, a phosphate group, a carboxylic acid amide group, a sulfonamide group, an imide acid group, a mercapto group, a halogen atom, a cyano group, an alkylsulfino group, an arylsulfino group, a hydrazino group, an imino group, and a heteroaryl group (preferably having 1 to 30 carbon atoms). In a case where the above-described groups can be further substituted, the groups may further have a substituent. Examples of the substituent which may be further included include the groups described regarding the substituent T.

In the metal azo pigment, it is preferable that at least one anion selected from an azo compound represented by Formula (I) or an azo compound having a tautomeric structure of the azo compound represented by Formula (I) and a metal ion form a metal complex. For example, in the case of a divalent metal ion Me, the anion and the metal ion form a metal complex having a structure represented by the following Formula (Ia). In addition, the metal ion Me may be bonded through a nitrogen atom in the tautomeric representation of Formula (Ia).

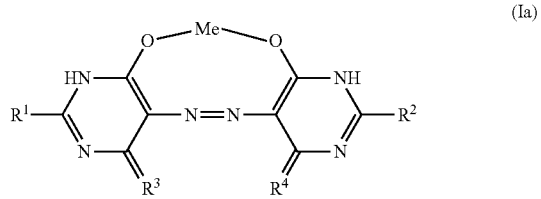

(Ia)

Examples of a preferable aspect of the metal azo pigment include metal azo pigments according to the following aspects (1) to (4). In particular, a metal azo pigment according to the aspect (1) is preferable.

(1) A metal azo pigment according to an aspect including at least one anion selected from an azo compound represented by Formula (I) or an azo compound having a tautomeric structure of the azo compound represented by Formula (I), metal ions including at least $Zn^{2+}$ and $Cu^{2+}$, and a melamine compound. In this aspect, the total content of $Zn^{2+}$ and $Cu^{2+}$ is preferably 95 to 100 mol %, more preferably 98 to 100 mol %, still more preferably 99.9 to 100 mol %, and even still more preferably 100% with respect to 1 mol of all the metal ions of the metal azo pigment. In addition, a molar ratio $Zn^{2+}:Cu^{2+}$ of $Zn^{2+}$ to $Cu^{2+}$ in the metal azo pigment is preferably 199:1 to 1:15, more preferably 19:1 to 1:1, and still more preferably 9:1 to 2:1. In addition, in this aspect, the metal azo pigment may further include a divalent or trivalent metal ion (hereinafter, also referred to as "metal ion Me1") in addition to $Zn^{2+}$ and $Cu^{2+}$. Examples of the metal ion Me1 include $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, and $Ba^{2+}$. Among these, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable, and at least one selected from $Al^{3+}$, $Fe^{2+}$, $Fe^{3+}$, $Co^{2+}$, or $Co^{3+}$ is still more preferable. The content of the metal ion Me1 is preferably 5 mol % or lower, more preferably 2 mol % or lower, and still more preferably 0.1 mol % or lower with respect to 1 mol of all the metal ions of the metal azo pigment.

(2) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Zn^{2+}$, and at least one metal ion Me2, and the metal ion Me2 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$, or $Pb^{2+}$. As the metal ion Me2, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mg^{2+}$, $Ca^{2+}$, $Sr^{2+}$, $Y^{3+}$, or $Mn^{2+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Zn^{2+}$ and $Ni^{2+}$ is 75 to 99.5 mol % and the content of the metal ion Me2 is 0.5 to 25 mol % with respect to 1 mol of all the metal ions of the metal azo pigment, it is more preferable that the total content of $Zn^{2+}$ and $Ni^{2+}$ is 78 to 95 mol % and the content of the metal ion Me2 is 5 to 22 mol % with respect to 1 mol of all the metal ions of the metal azo pigment, and it is still preferable that the total content of $Zn^{2+}$ and $Ni^{2+}$ is 82 to 90 mol % and the content of the metal ion Me2 is 10 to 18 mol % with respect to 1 mol of all the metal ions of the metal azo pigment. In addition, a molar ratio $Zn^{2+}:Ni^{2+}$ of $Zn^{2+}$ to $Ni^{2+}$ in the metal azo pigment is preferably 90:3 to 3:90, more preferably 80:5 to 5:80, and still more preferably 60:33 to 33:60.

(3) A metal azo pigment according to an aspect including at least one anion selected from an azo compound represented by Formula (I) or an azo compound having a tautomeric structure of the azo compound represented by Formula (I), metal ions, and a melamine compound, in which the metal ions further includes $Ni^{2+}$, $Cu^{2+}$, and at least one metal ion Me3, and the metal ion Me3 is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, or $Ba^{2+}$. As the metal ion Me3, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, and at least one selected from $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable. In this aspect, it is preferable that the total content of $Cu^{2+}$ and $Ni^{2+}$ is 70 to 99.5 mol % and the content of the metal ion Me3 is 0.5 to 30 mol % with respect to 1 mol of all the metal ions of the metal azo pigment, it is more preferable that the total content of $Cu^{2+}$ and $Ni^{2+}$ is 75 to 95 mol % and the content of the metal ion Me3 is 5 to 25 mol % with respect to 1 mol of all the metal ions of the metal azo pigment, and it is still more preferable that the total content of $Cu^{2+}$ and $Ni^{2+}$ is 80 to 90 mol % and the content of the metal ion Me3 is 10 to 20 mol % with respect to 1 mol of all the metal ions of the metal azo pigment. In addition, a molar ratio $Cu^{2+}:Ni^{2+}$ of $Cu^{2+}$ to $Ni^{2+}$ in the metal azo pigment is preferably 42:1 to 1:42, more preferably 10:1 to 1:10, and still more preferably 3:1 to 1:3.

(4) A metal azo pigment according to an aspect including at least one anion selected from an azo compound represented by Formula (I) or an azo compound having a tautomeric structure of the azo compound represented by Formula (I), metal ions, and a melamine compound, in which the metal ions include $Ni^{2+}$ and a metal ion Me4a, and the metal ion Me4a is at least one selected from $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, or $Yb^{3+}$. As the metal ion Me4a, at least one selected from $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, or $Yb^{3+}$ is preferable, and at least one selected from $La^{3+}$, $Ce^{3+}$, $Pr^{3+}$, $Nd^{3+}$, $Sm^{3+}$, $Tb^{3+}$, or $Ho^{3+}$ is more preferable. In this aspect, the total content of $Ni^{2+}$ and the metal ion Me4a is preferably 95 to 100 mol %, more preferably 98 to 100 mol %, still more preferably 99.9 to 100 mol %, and even still more preferably 100% with respect to 1 mol of all the metal ions of the metal azo pigment. In addition, a molar ratio $Ni^{2+}$: Metal ion Me4a of $Ni^{2+}$ to the metal ion Me4a in the metal azo pigment is preferably 1:1 to 19:1, more preferably 2:1 to 4:1, and still more preferably 2.3:1 to 3:1. In addition, in this aspect, the metal azo pigment may further include a metal ion (hereinafter, also referred to as "metal ion Me4b") in addition to $Ni^{2+}$ and the metal ion Me4a. Examples of the metal ion Me4b include $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Fe^{2+}$, $Fe^{3+}$, $Co^{2+}$, $Co^{3+}$, $Cu^{2+}$, $Zn^{2+}$, $Cd^{2+}$, $Al^{3+}$, and $Pb^{2+}$. Among these, at least one selected from $Mg^{2+}$, $Ca^{2+}$, $Sr^{2+}$, $Y^{3+}$, $Mn^{2+}$, $Fe^{2+}$, $Fe^{3+}$, $Co^{2+}$, $Co^{3+}$, $Cu^{2+}$, $Zn^{2+}$, or $Al^{3+}$ is preferable, and at least one selected from $Sr^{2+}$, $Fe^{2+}$, $Fe^{3+}$, $Co^{2+}$, $Co^{3+}$, $Cu^{2+}$, $Zn^{2+}$, or $Al^{3+}$ is more preferable. In addition, the content of the metal ion Me4b is preferably 5 mol % or lower, more preferably 2 mol % or lower, and still more preferably 0.1 mol % or lower with respect to 1 mol of all the metal ions of the metal azo pigment.

In the metal azo pigment, it is preferable that a metal azo compound composed of at least one anion selected from an azo compound represented by Formula (I) or an azo compound having a tautomeric structure of the azo compound represented by Formula (I) and metal ions and a melamine compound (preferably the compound represented by Formula (II)) form an adduct. It can be understood that the adduct is a molecular aggregate. For example, an intermolecular bond may be formed by an intermolecular interaction, by a Lewis acid-base interaction, or by a coordinate bond or a chain conjugation. In addition, the adduct may have a structure such as a clathrate compound in which a guest molecule is incorporated into a lattice of host molecules. In addition, the adduct may have a structure such as mixed intercalation crystals (including an interstitial compound). The mixed intercalation crystals refer to chemical non-stoichiometric crystalline compounds composed of at least two elements. In addition, the adduct may be mixed substitution crystals in which two materials form a common crystal and atoms of a second component are positioned at positions of a regular lattice of a first component.

The metal azo pigment may be a physical mixture or a chemical mixed compound. It is preferable that the metal azo pigment is a physical mixture.

In the case of the metal azo pigment according to the aspect (1), preferable examples of the physical mixture include (1-1) and (1-2) described below. In addition, in a case where the metal azo pigment according to the aspect (1) is a chemical mixed compound, it is preferable $Zn^{2+}$, $Cu^{2+}$, and any metal ion Me1 are incorporated into a common crystal lattice.

(1-1) A physical mixture including an adduct 1a of a metal azo compound composed of the anion and $Zn^{2+}$ and a melamine compound and an adduct 1b of a metal azo compound composed of the anion and $Cu^{2+}$ and a melamine compound.

(1-2) A physical mixture including the physical mixture (1-1) and an adduct 1c of a metal azo compound composed of the anion and the metal ion Me1 and a melamine compound.

In the case of the metal azo pigment according to the aspect (2), preferable examples of the physical mixture include (2-1) described below. In addition, in a case where the metal azo pigment according to the aspect (2) is a chemical mixed compound, it is preferable $Ni^{2+}$, $Zn^{2+}$, and the metal ion Me2 are incorporated into a common crystal lattice.

(2-1) A physical mixture including an adduct 2a of a metal azo compound composed of the anion and $Ni^{2+}$ and a melamine compound, an adduct 2b of a metal azo compound composed of the anion and $Zn^{2+}$ and a melamine compound, and an adduct 2c of a metal azo compound composed of the anion and the metal ion Me2 and a melamine compound.

In the case of the metal azo pigment according to the aspect (3), preferable examples of the physical mixture include (3-1) described below. In addition, in a case where the metal azo pigment according to the aspect (3) is a chemical mixed compound, it is preferable $Ni^{2+}$, $Cu^{2+}$, and the metal ion Me3 are incorporated into a common crystal lattice.

(3-1) A physical mixture including an adduct 3a of a metal azo compound composed of the anion and $Ni^{2+}$ and a melamine compound, an adduct 3b of a metal azo compound composed of the anion and $Cu^{2+}$ and a melamine compound, and an adduct 3c of a metal azo compound composed of the anion and the metal ion Me3 and a melamine compound.

In the case of the metal azo pigment according to the aspect (4), preferable examples of the physical mixture include (4-1) and (4-2) described below. In addition, in a case where the metal azo pigment according to the aspect (4) is a chemical mixed compound, it is preferable $Ni^{2+}$, the metal ion Me4a, and any metal ion Me4b are incorporated into a common crystal lattice.

(4-1) A physical mixture including an adduct 4a of a metal azo compound composed of the anion and $Ni^{2+}$ and a melamine compound and an adduct 4b of a metal azo compound composed of the anion and the metal ion Me4a and a melamine compound.

(4-2) A physical mixture including the physical mixture (4-1) and an adduct 4c of a metal azo compound composed of the anion and the metal ion Me4b and a melamine compound.

The metal azo pigment according to the aspect (1) can be manufactured by causing a compound represented by Formula (III) or a tautomer thereof to react with a zinc salt, a copper salt, and optionally a salt of the metal ion Me1 in the presence of a melamine compound (preferably the compound represented by Formula (II)).

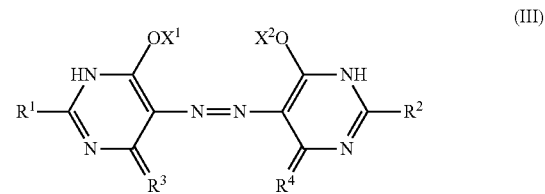

(III)

In the formula, $X^1$ and $X^2$ each independently represent a hydrogen atom or an alkali metal ion, and at least one of $X^1$ or $X^2$ represents an alkali metal ion. $R^1$ and $R^2$ each independently represent OH or $NR^5R^6$. $R^3$ and $R^4$ each independently represent =O or =NR$^7$, and $R^5$ to $R^7$ each independently represent a hydrogen atom or an alkyl group. $R^1$ to $R^7$ has the same definitions and the same preferable ranges as $R^1$ to $R^7$ in Formula (I). As the alkali metal ion represented by $X^1$ and $X^2$, $Na^+$ or $K^+$ is preferable.

The amount of the zinc salt used is preferably 0.05 to 0.995 mol, more preferably 0.05 to 0.5 mol, and still more preferably 0.1 to 0.3 mol with respect to 1 mol of the compound represented by Formula (III) or the tautomer thereof. In addition, the amount of the copper salt used is preferably 0.005 to 0.95 mol, more preferably 0.49 to 0.95 mol, and still more preferably 0.7 to 0.9 mol with respect to 1 mol of the compound represented by Formula (III) or the tautomer thereof. In addition, the amount of the metal ion Me1 used is preferably 0.05 mol or less and more preferably 0.01 mol or less with respect to 1 mol of the compound represented by Formula (III) or the tautomer thereof. In addition, it is preferable that the total amount of the zinc salt, the copper salt, and the metal ion Me1 is 1 mol with respect to 1 mol of the compound represented by Formula (III). In addition, the amount of the melamine compound used is preferably 0.05 to 4 mol, more preferably 0.5 to 2.5 mol, and still more preferably 1.0 to 2.0 mol with respect to 1 mol of the compound represented by Formula (III) or the tautomer thereof.

In addition, the metal azo pigment according to the aspect (1) can also be manufactured by mixing the adduct 1a, the adduct 1b, and the adduct 1c with each other.

The metal azo pigment according to the aspect (2), the metal azo pigment according to the aspect (3), and the metal azo pigment according to the aspect (4) can be manufactured using the same method as the above-described method.

The details of the metal azo pigment can be found in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

It is preferable that the coloring material that allows transmission of infrared light and shields visible light includes two or more selected from a red pigment, a blue pigment, a green pigment, a yellow pigment, and a violet pigment. That is, it is preferable that the coloring material that allows transmission of infrared light and shields visible light includes a combination of two or more selected from a red pigment, a blue pigment, a green pigment, a yellow pigment, and a violet pigment to form black. Examples of a preferable combination are as follows.

(1) An aspect in which a red pigment and a blue pigment are included.

(2) An aspect in which a red pigment, a blue pigment, and a yellow pigment are included.

(3) An aspect in which a red pigment, a blue pigment, a yellow pigment, and a violet pigment are included.

(4) An aspect in which a red pigment, a blue pigment, a yellow pigment, a violet pigment, and a green pigment are included.

(5) An aspect in which a red pigment, a blue pigment, a yellow pigment, and a green pigment are included.

(6) An aspect in which a red pigment, a blue pigment, and a green pigment are included.

In the aspect (1), a mass ratio red pigment:blue pigment between the red pigment and the blue pigment is preferably 20 to 80:20 to 80, more preferably 20 to 60:40 to 80, and still more preferably 20 to 50:50 to 80.

In the aspect (2), a mass ratio red pigment:blue pigment: yellow pigment between the red pigment, the blue pigment, and the yellow pigment is preferably 10 to 80:20 to 80:10 to 40, more preferably 10 to 60:30 to 80:10 to 30, and still more preferably 10 to 40:40 to 80:10 to 20.

In the aspect (3), a mass ratio red pigment:blue pigment: yellow pigment:violet pigment between the red pigment, the blue pigment, the yellow pigment, and the violet pigment is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (4), a mass ratio red pigment:blue pigment: yellow pigment:violet pigment:green pigment between the red pigment, the blue pigment, the yellow pigment, the violet pigment, and the green pigment is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the aspect (5), a mass ratio red pigment:blue pigment: yellow pigment:green pigment between the red pigment, the blue pigment, the yellow pigment, and the green pigment is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect (6), a mass ratio red pigment:blue pigment: green pigment between the red pigment, the blue pigment, and the green pigment is preferably 10 to 80:20 to 80:10 to 40, more preferably 10 to 60:30 to 80:10 to 30, and still more preferably 10 to 40:40 to 80:10 to 20.

(Organic Black Colorant)

In the present invention, examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available. The azo compound is not particularly limited, and for example, a compound represented by the following Formula (A-1) can be suitably used.

A-1

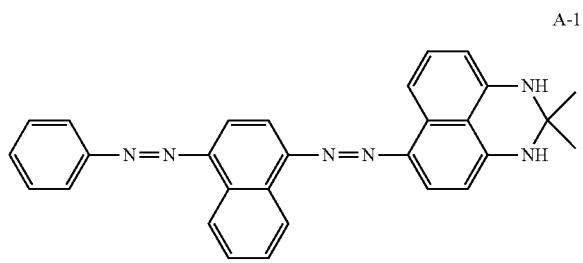 [SMILES: CC1(C)Nc2cccc3c(N=Nc4ccc(N=Nc5ccccc5)c5ccccc45)ccc(c23)N1]

In the present invention, it is preferable that the bisbenzofuranone compound is one of the following compounds represented by the following formulae or a mixture thereof.

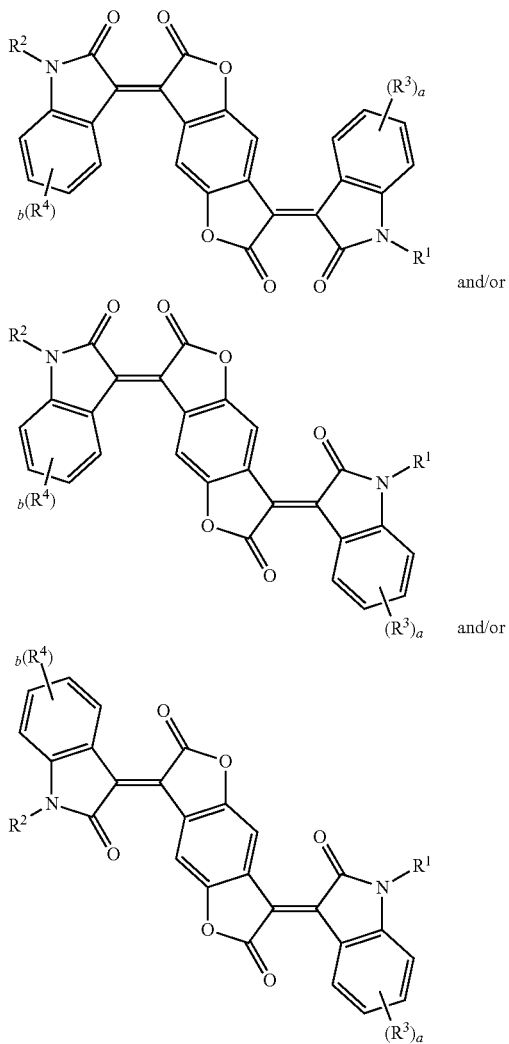

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$OCOR^{303}$, —$OCOR^{304}$, —$NR^{305}R^{306}$, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$. $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In the present invention, in a case where an organic black colorant is used as the coloring material that shields visible light, it is preferable that the organic black colorant is used in combination with a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination. In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

The content of the pigment in the coloring material that shields visible light is preferably 95 mass % or higher, more preferably 97 mass % or higher, and still more preferably 99 mass % or higher with respect to the total mass of the coloring material that shields visible light.

The content of the coloring material that shields visible light in the composition for forming a near infrared transmitting filter according to the embodiment of the present invention is preferably 40 to 75 mass % with respect to the total solid content of the composition. The upper limit is preferably 70 mass % or lower, and more preferably 65 mass % or lower. The lower limit is preferably 50 mass % or higher and more preferably 55 mass % or higher.

The composition for forming a near infrared transmitting filter may further include an infrared absorber. In near infrared transmitting filter, the infrared absorber has a function of limiting light to be transmitted (near infrared light) to a longer wavelength side. As the infrared absorber, a compound having an absorption maximum in a near infrared range (preferably a wavelength range of longer than 700 nm and 1300 nm or shorter) can be preferably used. As the infrared absorber, a pigment or a dye may be used. Examples of the infrared absorber include a pyrrolopyrrole compound, a cyanine compound, a phthalocyanine compound, a diiminium compound, a transition metal oxide, a squarylium compound, a naphthalocyanine compound, a quaterrylene compound, a dithiol metal complex compound, a croconium compound, and an oxonol compound. Examples of the pyrrolopyrrole compound include a compound described in paragraphs "0016" to "0058" of JP2009-263614A and a compound described in paragraphs "0037" to "0052" of JP2011-068731A, the contents of which are incorporated herein by reference. Examples of the squarylium compound include a compound described in paragraphs "0044" to "0049" of JP2011-208101A, the content of which is incorporated herein by reference. Examples of the cyanine compound include a compound described in paragraphs "0044"

and "0045" of JP2009-108267A and a compound described in paragraphs "0026" to "0030" of JP2002-194040A, the contents of which are incorporated herein by reference. Examples of the diiminium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. Examples of the oxonol compound include a compound described in paragraphs "0039" to "0066" of JP2006-001875A, the content of which is incorporated herein by reference. In addition, as the cyanine compound, the phthalocyanine compound, the diiminium compound, the squarylium compound, or the croconium compound, for example, a compound described in paragraphs "0010" to "0081" of JP2010-111750A may be used, the content of which is incorporated herein by reference. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

In addition, as the infrared absorber, inorganic particles can also be used. As the inorganic particles, metal oxide particles or metal particles are preferable from the viewpoint of further improving infrared shielding properties. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, particles of a tungsten oxide compound can be used. As the tungsten oxide compound, cesium tungsten oxide is preferable. The details of the tungsten oxide compound can be found in paragraph "0080" of JP2016-006476A, the content of which is incorporated herein by reference. The shape of the inorganic particles is not particularly limited and may have a sheet shape, a wire shape, or a tube shape irrespective of whether or not the shape is spherical or non-spherical.

In a case where the composition for forming a near infrared transmitting filter includes an infrared absorber, the content of the infrared absorber in the composition is preferably 1 to 60 mass % and more preferably 10 to 40 mass % with respect to the total solid content of the composition. In addition, the content of the infrared absorber is preferably 10 to 200 parts by mass, more preferably 20 to 150 parts by mass, and still more preferably 30 to 80 parts by mass with respect to 100 parts by mass of the coloring material that shields visible light. In the composition according to the embodiment of the present invention, as the infrared absorber, one infrared absorber may be used alone, or two or more infrared absorbers may be used in combination. In a case where two or more infrared absorbers are used in combination, it is preferable that the total content of the infrared absorbers is in the above-described range.

The composition for forming a near infrared transmitting filter may further include a resin, a curable compound, a solvent, and a surfactant. As the components, materials described below regarding the composition according to the embodiment of the present invention can be used. In addition, a composition described in WO2015/182277A can also be used, the content of which is incorporated herein by reference.

In addition, the near infrared transmitting filter can be formed by alternately laminating a low refractive index layer and a high refractive index layer. This near infrared transmitting filter can selectively allow transmission of near infrared light having a predetermined wavelength using a light interference effect. For example, by adjusting the thickness or the number of layers laminated regarding each of the high refractive index layer and the low refractive index layer, the shielding and/or transmission of the light having a specific wavelength can be controlled.

As a material for forming the high refractive index layer, a material having a refractive index of 1.7 or higher (preferably, a material having a refractive index of 1.7 to 4.0) at a wavelength of 635 nm can be used. Examples of the material include titanium oxide, zirconium oxide, tantalum pentoxide, niobium pentoxide, lanthanum oxide, yttrium oxide, zinc oxide, zinc sulfide, and indium oxide.

As a material for forming the low refractive index layer, a material having a refractive index of 1.6 or lower (preferably, a material having a refractive index of 1.0 to 1.6) at a wavelength of 635 nm can be used. Examples of the material include silica, alumina, lanthanum fluoride, magnesium fluoride, and sodium hexafluoroaluminate.

The refractive index of the high refractive index layer at a wavelength of 635 nm is preferably 1.5 to 3.0 and more preferably 1.7 to 2.3. The refractive index of the low refractive index layer at a wavelength of 635 nm is preferably 1.0 to 1.4 and more preferably 1.0 to 1.3. A difference between the refractive index of the high refractive index layer at a wavelength of 635 nm and the refractive index of the low refractive index layer at a wavelength of 635 nm is preferably 0.5 or higher, more preferably 0.55 or higher, and still more preferably 0.6 or higher. The upper limit is not particularly limited and is preferably 5 or lower. In addition, the total number of the low refractive index layers and the high refractive index layers laminated is preferably 5 or more, more preferably 8 or more, and still more preferably 10 or more. The upper limit is preferably 100 or less, more preferably 60 or less, still more preferably 40 or less, and even still more preferably 30 or less.

The near infrared transmitting filter in which the low refractive index layer and the high refractive index layer are alternately laminated can be formed by alternately laminating the high refractive index layer and the low refractive index layer using, for example, a vacuum deposition method such as a chemical vapor deposition (CVD) method or a sputtering method. In addition, the near infrared transmitting filter can also be formed by alternately applying a composition for forming a high refractive index layer and a composition for forming a low refractive index layer on a support or the like and drying the applied compositions. In addition, the details of the near infrared transmitting filter can be found in WO2015/198784A, the content of which is incorporated herein by reference.

<<High Refractive Index Member IR>>

The structure according to the embodiment of the present invention includes the high refractive index member IR having the above-described characteristics that is provided on the optical path of the near infrared transmitting filter on at least one of the incidence side into the near infrared transmitting filter or the emission side from the near infrared transmitting filter.

The high refractive index member IR allows transmission of light in a near infrared range (near infrared light). The wavelength of the near infrared light whose transmission is allowed by the high refractive index member IR may include at least near infrared light having a wavelength used for the detection in the infrared sensor and can be appropriately selected according to the kind of the near infrared transmitting filter. For example, it is preferable that the high refractive index member IR allows transmission of at least light having any one wavelength of 810 nm, 830 nm, 850 nm, or 940 nm. In addition, it is preferable that the high refractive index member IR allows transmission of near infrared light in a wavelength range in which transmission of light is allowed by the near infrared transmitting filter. In addition, the transmittance of the high refractive index member IR to near infrared light is preferably as high as possible, more preferably 70% to 100%, and still more preferably 80% to 100%.

The refractive index of the high refractive index member IR to near infrared light is 1.7 or higher and preferably 1.7 to 4.0. The lower limit is preferably 1.75 or higher, more preferably 1.8 or higher, and still more preferably 1.85 or higher. The upper limit is preferably 3.5 or lower, more preferably 3.0 or lower, and still more preferably 2.5 or lower.

It is preferable that the refractive index is a value for light having any wavelength of 810 nm, 850 nm, or 940 nm.

In addition, in a case where the structure according to the embodiment of the present invention is used for the infrared sensor, it is preferable that the value of the refractive index is a value of the refractive index to near infrared light having a wavelength used for the detection in the infrared sensor. For example, in the case of the infrared sensor used for sensing light having a wavelength of 940 nm (infrared light), it is preferable that the value of the refractive index of the high refractive index member IR is a value of the refractive index for the light having a wavelength of 940 nm.

The transmittance of the high refractive index member IR to light (visible light) in a visible range is not particularly limited. The transmittance to visible light may be low or high.

For example, in a case where the transmittance of the high refractive index member IR to visible light is high, the high refractive index member IR can be used as a high refractive index member (for example, a microlens or an optical waveguide) for visible light (for a color filter). In addition, in a case where the high refractive index member IR is used in combination with a high refractive index member for visible light (for a color filter), the influence on the high refractive index member for visible light can be suppressed, and excellent sensing properties of visible light can be maintained. Preferable examples of the high refractive index member IR having a high transmittance to visible light include an aspect in which the average transmittance of the high refractive index member IR to light in a wavelength range of 400 to 700 nm is 80% to 100% (more preferably 90% to 100% and still more preferably 95% to 100%).

On the other hand, from the viewpoint of improving the sensitivity in the sensing process using near infrared light, it is preferable that the transmittance of the high refractive index member IR to visible light is low. In a case where the transmittance of the high refractive index member IR to visible light is low, visible light shielding properties can be improved. Therefore, in the sensing process using near infrared light, noise generated from visible light can be reduced, and the sensor sensitivity can be further improved. Preferable examples of the high refractive index member IR having a low transmittance to visible light include an aspect in which the average transmittance of the high refractive index member IR to light in a wavelength range of 400 to 700 nm is 0% or higher and lower than 80% (more preferably 0% to 50% and still more preferably 0% to 20%).

In addition, in the high refractive index member IR, B/A which is a ratio of a maximum value B of an absorbance in a wavelength range of 400 nm or longer and shorter than 800 nm to a maximum value A of an absorbance in a wavelength range of 800 nm to 2000 nm can also be adjusted to be 1.0 or higher. In this case, the lower limit value of the value of B/A is preferably 1.0 or higher and more preferably 2.0 or higher. The upper limit value of the value of B/A is preferably 7000 or lower and more preferably 500 or lower.

The high refractive index member IR can be manufactured using a composition including at least one selected from a resin or particles. In a case where the member is manufactured using this composition, the member allows transmission of near infrared light and has a refractive index of 1.7 or higher to near infrared light (hereinafter, this composition will also be referred to as "composition for forming a high refractive index member"). The details of the composition for forming a high refractive index member will be described below.

The shape of the high refractive index member IR is not particularly limited. The shape of the high refractive index member IR can be appropriately selected depending on the purpose. Examples of the shape of the high refractive index member IR include a lens shape, a plate shape, a film shape, a layer shape, a columnar shape, and a spherical shape.

Examples of the use of the high refractive index member IR include a microlens, an optical waveguide, a protective film, a planarizing film, and a partition wall.

In the structure according to the embodiment of the present invention, the high refractive index member IR is not particularly limited as long as it is provided on the optical path of the near infrared transmitting filter. For example, the high refractive index member IR may be provided on either or both of the incidence side into the near infrared transmitting filter and the emission side from the near infrared transmitting filter.

In a case where the high refractive index member IR is provided on the incidence side into the near infrared transmitting filter, it is preferable that the high refractive index member IR has a lens shape. The high refractive index member IR can be preferably used as a microlens. Examples of the lens shape include a concave lens and a convex lens, and the lens shape can be selected according to the use.

The microlens can be manufactured using a well-known method of the related art. For example, the microlens can be manufactured using a transfer method, an imprint method, or a method of thermally sagging the composition for forming a high refractive index member. Among these, a transfer method is preferable from the viewpoint that the control of a lens shape can be easily performed.

A method of manufacturing the microlens using a transfer method include: applying the composition for forming a high refractive index member on a support to form a composition layer for forming a high refractive index member; forming a resist layer on the composition layer for forming a high refractive index member; forming a pattern having a lens shape on the resist layer; dry-etching the composition layer for forming a high refractive index member by using the resist layer on which the pattern is formed as a mask; and transferring the lens shape to the composition layer for forming a high refractive index member. In addition, examples of the method of manufacturing the microlens using a transfer method include methods described in JP2006-073605A, JP2006-190903A, JP2008-281414A, and JP2014-029524A, the contents of which are incorporated herein by reference.

A method of manufacturing the microlens using an imprint method include: applying a composition for forming a high refractive index member to a support or a mold having a pattern; interposing the composition for forming a high refractive index member between the mold and the support; curing the composition for forming a high refractive index member in a state where the composition for forming a high refractive index member is interposed between the mold and the support; and releasing the mold from the support.

In a case where the high refractive index member IR is provided on the emission side from the near infrared transmitting filter, the high refractive index member IR can be preferably used as an optical waveguide, an underlayer, or an antireflection layer. In addition, in a case where the high refractive index member IR is used as an optical waveguide, it is preferable that a low refractive index member IR having a lower refractive index to near infrared light (for example, light having a wavelength of 810 nm, 850 nm, or 940 nm, preferably light having a wavelength used for the detection in the infrared sensor) than the high refractive index member IR is provided around the high refractive index member IR. According to this aspect, light (near infrared light) emitted from the near infrared transmitting filter can be efficiently transmitted to a light-receiving element. Examples of this optical waveguide include a structure illustrated in FIG. 3 including: a core portion 1 that is formed of the high refractive index member IR; and a cladding portion 2 that is formed the low refractive index member IR covering an outer circumference of the core portion.

The refractive index of the low refractive index member IR to near infrared light (for example, light having a wavelength of 810 nm, 850 nm, or 940 nm, preferably light having a wavelength used for the detection in the infrared sensor) is preferably 0.01 to 1.5. The lower limit is preferably 0.02 or higher, more preferably 0.05 or higher, and still more preferably 0.1 or higher. The upper limit is preferably 1.45 or lower, more preferably 1.4 or lower, and still more preferably 1.35 or lower. In addition, a difference between the refractive index of the high refractive index member IR to near infrared light and the refractive index of the low refractive index member IR to near infrared light is preferably 0.1 or higher, more preferably 0.2 or higher, and still more preferably 0.3 or higher. The upper limit is preferably 4.0 or lower and more preferably 3.5 or lower.

One embodiment of the structure according to the present invention will be described using FIG. 1. In a structure 10 illustrated in FIG. 1, a near infrared transmitting filter 12 is formed on a support 11. Examples of the support 11 include a substrate formed of a material such as silicon, non-alkali glass, soda glass, PYREX (registered trade name) glass, or quartz glass. In addition, a solid image pickup element such as a charge coupled device (CCD) or a complementary metal-oxide semiconductor (CMOS) may be formed on the support 11. In addition, an undercoat layer may be formed on the support 11 to improve adhesiveness with a layer above the support 11, to prevent diffusion of materials, or to make a surface of the substrate flat. The near infrared transmitting filter 12 is a filter having the above-described spectral characteristics that shields light in a visible range and allows transmission of at least a part of light in a near infrared range. In a case where the support 11 on which the solid image pickup element is formed is used, the near infrared transmitting filter 12 is formed on a light receiving section of the solid image pickup element. A microlens 13 is formed on the near infrared transmitting filter 12. In the structure 10 illustrated in FIG. 1, the microlens 13 is formed of the high refractive index member IR having the above-described characteristics.

Figure 2:
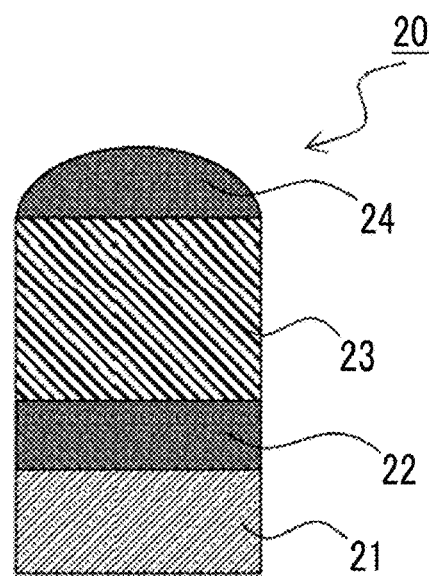
FIG. 2 is a schematic diagram illustrating a configuration of one embodiment of the structure according to the present invention.
Figure 3:
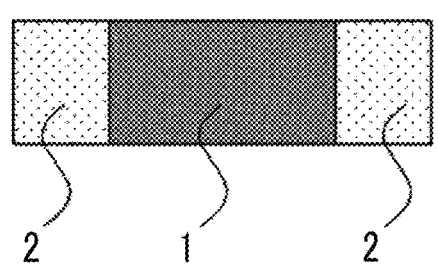
FIG. 3 is a schematic diagram illustrating one embodiment of an optical waveguide.

Another embodiment of the structure according to the present invention will be described using FIG. 2. In a structure 20 illustrated in FIG. 2, an optical waveguide 22 is formed on a support 21. In addition, a near infrared cut filter 23 is formed on the optical waveguide 22. In addition, a microlens 24 is formed on the near infrared cut filter 23. In the structure illustrated in FIG. 2, the optical waveguide 22 and/or the microlens 24 is formed of the high refractive index member IR having the above-described characteristics. Although not illustrated in FIG. 2, the optical waveguide 22 may include a core portion and a cladding portion as illustrated in FIG. 3.

The spectral characteristics of the structure according to the embodiment of the present invention can be appropriately selected according to the use. Examples of the spectral characteristics of the structure according to the embodiment of the present invention include the following aspects (1) to (3).

(1) A structure in which the near infrared transmitting filter is a filter that allows transmission of at least light having a wavelength of 940 nm, and the high refractive index member IR is a structure that allows transmission of at least light having a wavelength of 940 nm and has a refractive index of 1.7 or higher for light having a wavelength of 940 nm. This structure can be used as an infrared sensor used for sensing light having a wavelength of 940 nm. For example, the structure can be preferably used as a proximity sensor, a motion sensor, a distance measuring sensor, a biometric sensor, or a healthcare sensor. By using the light having a wavelength of 940 nm, noise generated from visible light can be reduced, and high-accuracy sensing can be performed.

(2) A structure in which the near infrared transmitting filter is a filter that allows transmission of at least light having a wavelength of 850 nm, and the high refractive index member IR is a structure that allows transmission of at least light having a wavelength of 850 nm and has a refractive index of 1.7 or higher for light having a wavelength of 850 nm. This structure can be used as an infrared sensor used for sensing light having a wavelength of 850 nm. For example, the structure can be preferably used as a proximity sensor, a motion sensor, a distance measuring sensor, a biometric sensor, or a healthcare sensor.

(3) A structure in which the near infrared transmitting filter is a filter that allows transmission of at least light having a wavelength of 810 nm, and the high refractive index member IR is a structure that allows transmission of at least light having a wavelength of 810 nm and has a refractive index of 1.7 or higher for light having a wavelength of 810 nm. This structure can be used as an infrared sensor used for sensing light having a wavelength of 810 nm. For example, the structure can be preferably used as an iris sensor, a proximity sensor, a motion sensor, a distance measuring sensor, a biometric sensor, or a healthcare sensor.

It is also preferable that the structure according to the embodiment of the present invention includes a color filter including a chromatic colorant. According to this aspect, image recognition using a color image and sensing using near infrared light can be performed at the same time.

The color filter can be manufactured using a coloring composition including a chromatic colorant. Examples of the chromatic colorant include the chromatic colorants described above. The coloring composition may further include, for example, a resin, a curable compound, a photopolymerization initiator, a surfactant, an organic solvent, and a polymerization inhibitor. As these components materials used for a coloring composition for a well-known color filter can be used. In addition, the materials described regarding the composition according to the embodiment of the present invention can also be used.

An embodiment of the structure according to the present invention that further includes a color filter will be described using FIGS. 4 and 5.

Figure 4:
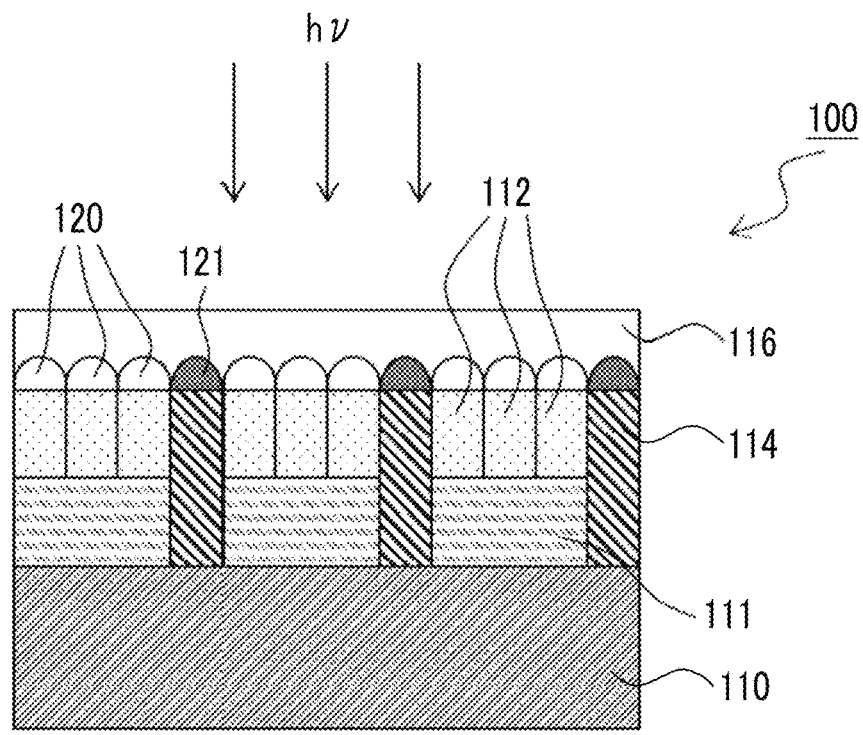
FIG. 4 is a schematic diagram illustrating one embodiment of the structure according to the present invention.

In a structure 100 illustrated in FIG. 4, reference numeral 110 represents a support. Examples of the support include the above-described examples. Hereinafter, an example in which a solid image pickup element is used as the support will be described. In this structure 100, near infrared cut filters 111 and near infrared transmitting filters 114 are formed on a light receiving section (not illustrate) of the support (solid image pickup element) 110. The near infrared cut filter 111 is a filter a filter that allows transmission of visible light (for example, light in a wavelength range of 400 to 700 nm) and shields near infrared light (for example, at least a part of light in a wavelength range of 800 to 1300 nm). The near infrared transmitting filter 114 is a filter having the above-described spectral characteristics that shields light in a visible range and allows transmission of at least a part of light in a near infrared range.

Color filters 112 are laminated on the near infrared cut filters 111. The color filter 112 is a filter on which a pixel pattern that allows transmission of visible light having a specific wavelength and absorbs the visible light. For example, a filter on which pixel patterns of red (R), green (G), and blue (B) are formed is used as the color filter 112.

Microlenses 120 and 121 are disposed on an incidence ray hv side of the color filters 112 and the near infrared transmitting filters 114. A planarizing layer 116 is formed so as to cover each of the microlenses.

In the structure, the microlenses 121 provided on the near infrared transmitting filters 114 are formed of the high refractive index member IR having the above-described characteristics. The microlenses 120 provided on the color filters 112 may be formed of the high refractive index member IR having the above-described characteristics, or well-known microlenses for a color filter of the related art can also be used. The details of the well-known microlenses for a color filter of the related art can be found in JP2014-029524A, JP2015-193809A, JP2014-162830A, and JP2012-255148A, the contents of which are incorporated herein by reference.

Figure 5:
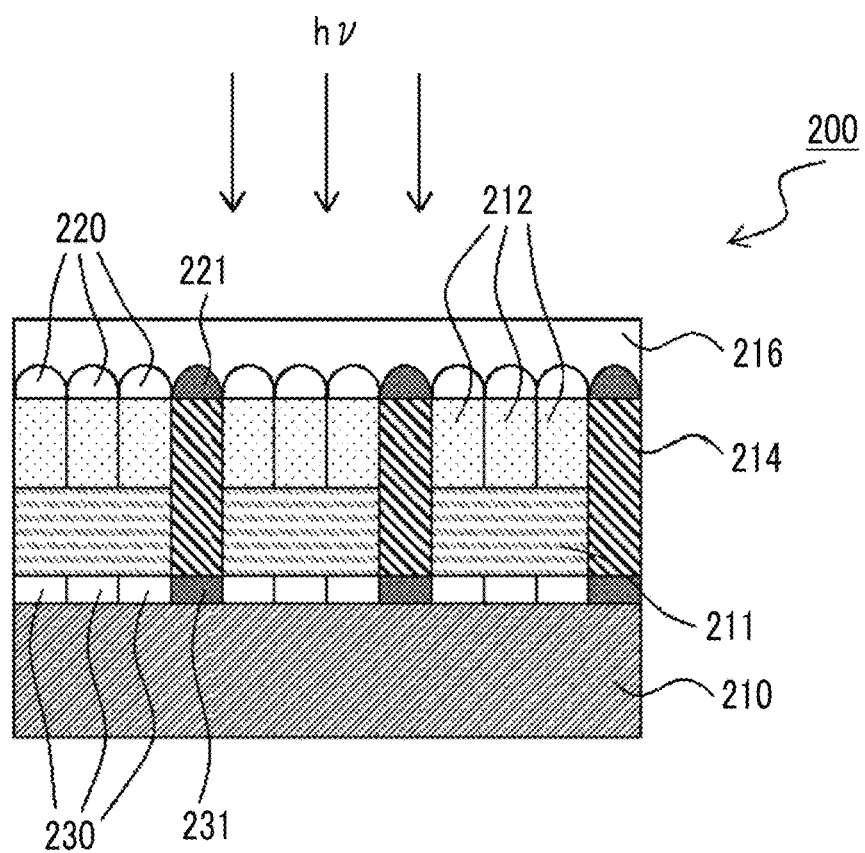
FIG. 5 is a schematic diagram illustrating one embodiment of the structure according to the present invention.

In a structure 200 illustrated in FIG. 5, reference numeral 210 represents a support. Examples of the support include the above-described examples. Hereinafter, an example in which a solid image pickup element is used as the support will be described.

In this structure 200, near infrared cut filters 211 and near infrared transmitting filters 214 are formed on a light receiving section (not illustrate) of the support (solid image pickup element) 210. In addition, optical waveguides 230 and 231 are formed between the support (solid image pickup element) 210 and the near infrared cut filters 211 and between the support (solid image pickup element) 210 and the near infrared transmitting filters 214, respectively.

The color filters 212 are laminated on the near infrared cut filters 211. In addition, microlenses 220 and 221 are disposed on an incidence ray hv side of the color filters 212 and the near infrared transmitting filters 214. A planarizing layer 216 is formed so as to cover each of the microlenses.

In this structure, the microlenses 221 that provided on the near infrared transmitting filters 214 and/or the optical waveguides 231 that are formed between the support (solid image pickup element) 210 and the near infrared transmitting filters 214 are formed of the high refractive index member IR having the above-described characteristics. The microlenses 220 provided on the color filters 212 may be formed of the high refractive index member IR having the above-described characteristics, or well-known microlenses for a color filter of the related art can also be used. In addition, the optical waveguides 230 that are formed between the support (solid image pickup element) 210 and the near infrared cut filters 211 may be formed of the high refractive index member IR having the above-described characteristics, or well-known optical waveguides for a color filter of the related art can also be used. The details of the well-known optical waveguides for a color filter of the related art can be found in JP2015-215467A, the contents of which are incorporated herein by reference.

In addition, in the embodiment illustrated in FIGS. 4 and 5, the color filters 112 (212) are provided on the incidence ray hv side compared to the near infrared cut filters 111 (211). The lamination order of the near infrared cut filters 111 (211) and the color filters 112 (212) may be reversed, and the near infrared cut filters 111 (211) may be provided on the incidence ray hv side compared to the color filters 112 (212).

In the embodiment illustrated in FIGS. 4 and 5, the near infrared cut filters 111 (211) and the color filters 112 (212) are laminated adjacent to each other. However, the near infrared cut filters 111 (211) and the color filters 112 (212) are not necessarily provided adjacent to each other, and another layer may be provided therebetween.

The structure according to the embodiment of the present invention can also be used for a solid image pickup element, an infrared sensor, or the like. With the structure according to the embodiment of the present invention, near infrared light collecting properties can be improved, and the sensitivity of a solid image pickup element or an infrared sensor to near infrared light can be improved. Therefore, higher-accuracy sensing can be performed.

<Solid Image Pickup Element and Infrared Sensor>

Next, a solid image pickup element according to an embodiment of the present invention will be described. The solid image pickup element according to the embodiment of the present invention is not particularly limited as long as it includes the structure according to the embodiment of the present invention and functions as a solid image pickup element. In addition, an infrared sensor according to an embodiment of the present invention is not particularly limited as long as it includes the structure according to the embodiment of the present invention and functions as an infrared sensor. For example, the following configuration can be adopted.

The solid image pickup element includes a plurality of photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the structure according to the embodiment of the present invention is formed on the device protective film.

<Composition According to Embodiment of Present Invention (Composition for Forming High Refractive Index Member)

Next, a composition according to an embodiment of the present invention (composition for forming a high refractive index member) will be described. The composition according to the embodiment of the present invention is a composition for forming the member of the above-described structure and includes at least one selected from a resin or particles. In a case where a film having a thickness of 0.1 µm is formed using this composition, the film allows transmission of light in a near infrared range and has a refractive index of 1.7 or higher for the light in the near infrared range.

It is preferable that the film used for the evaluation of the transmittance and the refractive index described above is formed by applying the composition for forming a high refractive index member to a support and drying the applied composition for forming a high refractive index member at 200° C. for 5 minutes. Characteristics of the film such as a refractive index or a transmittance and preferable ranges thereof are the same as described above regarding the high refractive index member IR.

It is preferable that the composition according to the embodiment of the present invention has high transmittance to light in a near infrared range for the purposes of, for example, allowing transmission of required light or improving the sensitivity or the like. Specifically, in a case where a cured film having a thickness of 1.0 µm is formed using the composition according to the embodiment of the present invention, a light transmittance of the cured film in a thickness direction in the entire wavelength range of 700 to 1200 nm is preferably 90% or higher. It is preferable that each of the components used for the composition is selected from components satisfying the above-described transmittance conditions.

<Particles>

It is preferable that the composition according to the embodiment of the present invention includes particles. The refractive index of the particles to near infrared light is preferably 1.7 or higher and more preferably 1.7 to 4.0 The lower limit is preferably 1.75 or higher, more preferably 1.8 or higher, and still more preferably 1.85 or higher. The upper limit is preferably 3.9 or lower, more preferably 3.5 or lower, and still more preferably 3.0 or lower. It is preferable that the refractive index is a value for light having any wavelength of 810 nm, 850 nm, or 940 nm. In addition, in a case where the structure according to the embodiment of the present invention is used for the infrared sensor, it is preferable that the value of the refractive index is a value of the refractive index to near infrared light having a wavelength used for the detection in the infrared sensor.

The refractive index of the particles can be measured using the following method. First, a dispersion is prepared using the particles, a resin (dispersant) having a known refractive index, and propylene glycol monomethyl ether acetate. Next, the prepared dispersion and a resin (dispersant) having a known refractive index are mixed with each other to prepare coating solutions in which the concentrations of the particles is 10 mass %, 20 mass %, 30 mass %, and 40 mass % with respect to the total solid content of the coating solutions. Using each of the coating solutions, a film having a thickness of 300 nm is formed on a silicon wafer, and the refractive index of the obtained film is measured by ellipsometry (LAMBDA ACE RE-3300 (trade name), manufactured by Screen Holdings Co., Ltd.). Next, the concentration and refractive index of the particles is plotted on a graph to calculate the refractive index of the particles.

The average primary particle size of the particles is preferably 1 to 1000 nm. The upper limit is preferably 900 nm or less and more preferably 500 nm or less. The lower limit is preferably 2 nm or more and more preferably 5 nm or more. In the present invention, as a value of the average primary particle size of the particles, the number average primary particle size calculated from a primary particle size distribution of the particles is used. The primary particle sizes of the particles can be obtained by observing the particles with a transmission electron microscope (TEM) and observing a portion where particles do not aggregate. The primary particle size distribution can be obtained by observing primary particles with a transmission electron microscope and processing images thereof using an image processing device. As the transmission electron microscope, a transmission electron microscope (H-7000, manufactured by Hitachi, Ltd.) can be used. As the image processing device, LUZEX AP (manufactured by Nireco Corporation) can be used.

Examples of the particles include inorganic particles and organic particles. Among these, organic particles are preferable from the viewpoint that a member having a high refractive index to near infrared light can be easily obtained.

As the inorganic particles, particles of an inorganic compound can be used. For example, an iron compound such as Ge, $\varepsilon Fe_2O_3$, BaFe, or SrFe can also be used. In addition, for example, a metal oxide or magnetic particles can also be used.

As the organic particles, particles of an organic compound can be used. As the organic compound, for example, a well-known pigment or dye can be used. From the viewpoint of increasing the refractive index, a compound having high polarization is preferable. In addition, in order to obtain a high refractive index in a specific near infrared range, it is preferable that the organic compound has an absorption peak in the vicinity of a desired wavelength. In addition, since transparency is required at a specific near infrared wavelength, it is preferable that the organic compound has a sharp absorption. Specific examples of the organic compound include a phthalocyanine compound and a naphthalocyanine compound.

Examples of the phthalocyanine compound include a compound represented by Formula (PC) and a compound represented by Formula (PC-1). Among these a compound represented by Formula (PC) is preferable.

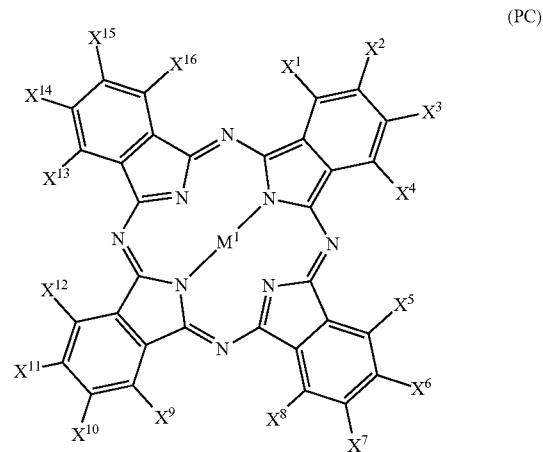

(PC)

-continued

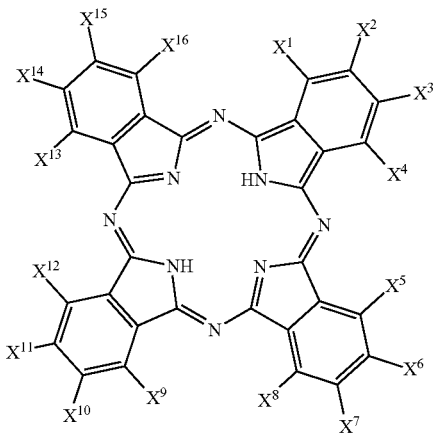

(PC-1)

In Formulae (PC) and (PC-1), $X^1$ to $X^{16}$ each independently represent a hydrogen atom or a substituent. In Formula (PC), $M^1$ represents a metal atom or an inorganic compound.

Examples of the substituent represented by $X^1$ to $X^{16}$ include an alkyl group, an alkenyl group, an alkynyl group, an aryl group, a heteroaryl group, an amino group, an alkoxy group, an aryloxy group, a heteroaryloxy group, an acyl group, an alkoxycarbonyl group, an aryloxycarbonyl group, an acyloxy group, an acylamino group, an alkoxycarbonylamino group, an aryloxycarbonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a hydroxyl group, a mercapto group, a halogen atom, a cyano group, a sulfo group, a carboxyl group, a nitro group, a hydroxamic acid group, a sulfino group, a hydrazino group, and an imino group. Other examples of the substituent include a halogen atom, an alkoxy group, an arylalkoxy group, a heteroarylalkoxy group, an amino group, an alkylthio group, an arylthio group, and a heteroarylthio group. From the viewpoint of increasing the refractive index to near infrared light, a compound having high polarization is preferable. As the substituent, an electron-withdrawing group is preferable. In particular, for example, a halogen such as F, Cl, Br, or I, a nitro group, or a cyano group is preferable.

Examples of the metal atom represented by $M^1$ include Li, Na, Mg, Mn, Fe, Co, Ni, Cu, Zn, Sn, Pb, and Pt. Examples of the inorganic compound include VO, TiO, AlCl, $SiCl_2$, and $SnCl_2$. In addition, as $M^1$ coordinated to a phthalocyanine ring goes down and to the right side of the periodic table, the density of the phthalocyanine compound increases.

From the viewpoint of increasing the refractive index to near infrared light, a compound having high polarization is preferable as the phthalocyanine compound. From this viewpoint, it is preferable that at least one of $X^1$, . . . , or $X^{16}$ in Formulae (PC) and (PC-1) represents a substituent. In addition, as the substituent, an electron-withdrawing group is preferable. In particular, for example, a halogen atom such as F, Cl, Br, or I, a nitro group, or a cyano group is more preferable.

In the present invention, examples of the naphthalocyanine compound include a compound represented by Formula (NPC) and a compound represented by Formula (NPC-1). Among these a compound represented by Formula (NPC) is preferable.

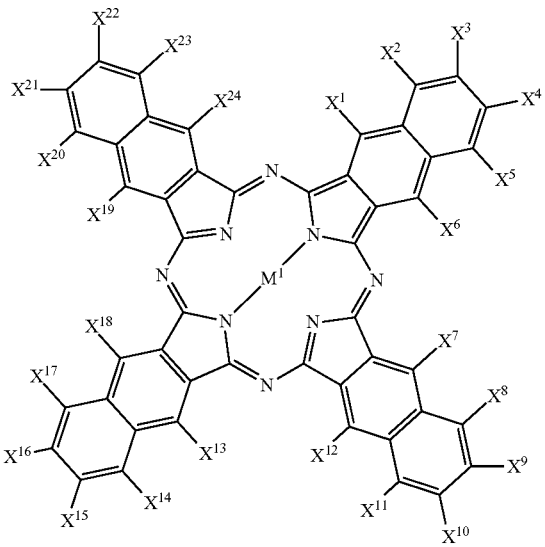

(NPC)

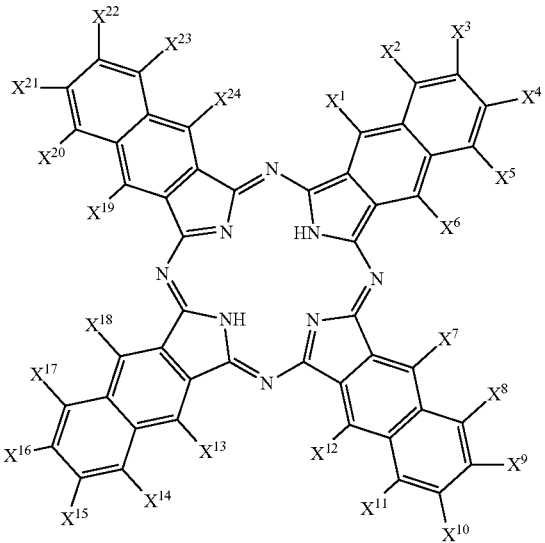

(NPC-1)

In Formulae (NPC) and (NPC-1), $X^1$ to $X^{24}$ each independently represent a hydrogen atom or a substituent. In Formula (NPC), $M^1$ represents a metal atom or an inorganic compound. Examples of the substituent represented by X1 to X24 in Formulae (NPC) and (NPC-1) include the substituents represented by $X^1$ to $X^{16}$ represented by Formula (PC). Examples of the metal atom and the inorganic compound represented by $M^1$ in Formula (PC) include the metal atoms and the inorganic compounds described above regarding $M^1$ in Formula (PC). As $M^1$ coordinated to a naphthalocyanine ring goes down and to the right side of the periodic table, the density of the naphthalocyanine compound increases.

From the viewpoint of increasing the refractive index to near infrared light, a compound having high polarization is preferable as the naphthalocyanine compound. From this viewpoint, it is preferable that at least one of $X^1, \ldots,$ or $X^{24}$ in Formulae (NPC) and (NPC-1) represents a substituent. In addition, as the substituent, an electron-withdrawing group is preferable. In particular, for example, a halogen atom such as F, Cl, Br, or I, a nitro group, or a cyano group is more preferable.

Specific examples of the organic particles include particles of a phthalocyanine compound such as phthalocyanine, lithium phthalocyanine, sodium phthalocyanine, magnesium phthalocyanine, chloroaluminum phthalocyanine, silicon dichloride phthalocyanine, titanium phthalocyanine, vanadium oxide phthalocyanine, manganese phthalocyanine, iron phthalocyanine, cobalt phthalocyanine, nickel phthalocyanine, α-type copper phthalocyanine, β-type copper phthalocyanine, ε-type copper phthalocyanine, zinc phthalocyanine, tin phthalocyanine, tin dichloride phthalocyanine, lead phthalocyanine, platinum phthalocyanine, or nitrile phthalocyanine and particles of a naphthalocyanine compound such as naphthalocyanine. In addition, as the particles of the phthalocyanine compound, for example, C.I. Pigment Blue 15, 15:1, 15:2, 15:3, 15:4, 15:6, or 16 C.I. Pigment Green 7, 36, 58, or 59 can also be used.

In the composition according to the embodiment of the present invention, the content of the particles is preferably 0.01 to 80 mass % with respect to the total solid content of the composition. The lower limit is preferably 1 mass % or higher, more preferably 5 mass % or higher, and still more preferably 10 mass % or higher. The upper limit is preferably 75 mass %% or lower, more preferably 70 mass % or lower, still more preferably 65 mass % or lower, and even still more preferably 60 mass % or lower. In a case where the content of the particles in the composition is 80 mass % or lower (preferably 75 mass % or lower and more preferably 70 mass % or lower), when a member having a lens shape is manufactured using a transfer method, the smoothness of the member surface can be improved.

In addition, in a case where the composition according to the embodiment of the present invention includes particles and a resin, the content of the particles is preferably 1 to 100 parts by mass, more preferably 1 to 50 parts by mass, and still more preferably 1 to 30 parts by mass with respect to 100 parts by mass of the resin. By including the particles and the resin at the above-described ratio, the smoothness of the member surface can be improved when a member having a lens shape is manufactured using a transfer method.

<<Resin>>

It is preferable that the composition according to the embodiment of the present invention includes a resin. The resin is mixed, for example, in order to disperse the particles in the composition and to be used as a binder. The resin which is mainly used to disperse particles and the like in the composition will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, a (meth)acrylamide resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, and a siloxane resin.

In the present invention, a resin (hereinafter, also referred to as "high refractive index resin") having a refractive index of 1.7 or higher to near infrared light may be used as the resin. The refractive index of the resin to near infrared light is preferably 1.7 to 4.0. The lower limit is preferably 1.75 or higher, more preferably 1.8 or higher, and still more preferably 1.85 or higher. The upper limit is preferably 3.9 or lower, more preferably 3.5 or lower, and still more preferably 3.0 or lower. It is preferable that the refractive index is a value for light having any wavelength of 810 nm, 850 nm, or 940 nm. In addition, in a case where the structure according to the embodiment of the present invention is used for the infrared sensor, it is preferable that the value of the refractive index is a value of the refractive index to near infrared light having a wavelength used for the detection in the infrared sensor. The high refractive index resin can be used as a binder or a dispersant.

The refractive index of the resin can be measured using the following method in a state where the resin is not cured. As a specific measurement method, a film having a thickness of 300 nm that is formed of only a resin as a measurement target is formed on a silicon wafer, and the refractive index of the obtained film is measured by ellipsometry (LAMBDA ACE RE-3300 (trade name), manufactured by Screen Holdings Co., Ltd.).

The resin used in the present invention may have an acid group. Examples of the acid group include a carboxyl group, a phosphate group, a sulfo group, and a phenolic hydroxyl group. Among these acid groups, one kind may be used alone, or two or more kinds may be used in combination. The resin having an acid group can also be used as an alkali-soluble resin or a dispersant.

The weight-average molecular weight (Mw) of the resin having an acid group is preferably 5000 to 200000. The upper limit is preferably 100000 or lower and more preferably 20000 or lower. In addition, the number-average molecular weight (Mn) of the alkali-soluble resin is preferably 1000 to 20000.

The acid value of the resin having an acid group is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and most preferably 120 mgKOH/g or lower.

As the resin having an acid group, a polymer having a carboxyl group at a side chain is preferable. Specific examples of the resin include an alkali-soluble phenol resin such as a novolac resin, a methacrylic acid copolymer, an acrylic acid copolymer, an itaconic acid copolymer, a crotonic acid copolymer, a maleic acid copolymer, a partially esterified maleic acid copolymer, an acidic cellulose derivative having a carboxyl group at a side chain thereof, and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including a compound represented by the following Formula (ED1) and/or a compound represented by the following Formula (ED2) (hereinafter, these compounds will also be referred to as "ether dimer") is also preferable.

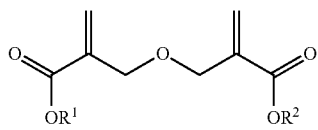
(ED1)

In Formula (ED1), $R^1$ and $R^2$ each independently represent a hydrocarbon group having 1 to 25 carbon atoms which may have a substituent or a hydrogen atom.

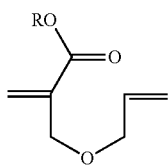
(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

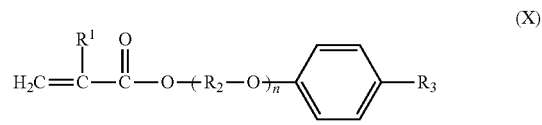
(X)

In Formula (X), $R_1$ represents a hydrogen atom or a methyl group, $R_2$ represents an alkylene group having 2 to 10 carbon atoms, and $R_3$ represents an alkyl group having 1 to 20 carbon atoms which may have a benzene ring or a hydrogen atom. n represents an integer of 1 to 15.

The details of the resin having an acid group can be found in paragraphs "0558" to "0571" of JP2012-208494A (paragraphs "0685" to "0700" of corresponding US2012/0235099A) and paragraphs "0076" to "0099" of JP2012-198408A, the contents of which are incorporated herein by reference.

The resin may have a curable group. Examples of the curable group include a group having an ethylenically unsaturated bond, an epoxy group, a methylol group, and an alkoxysilyl group. Examples of the group having an ethylenically unsaturated bond include a vinyl group, a (meth)allyl group, a (meth)acryloyl group, and a (meth)acryloyloxy group. Examples of the alkoxysilyl group include a monoalkoxysilyl group, a dialkoxysilyl group, and a trialkoxysilyl group. A resin having a curable group is also a curable compound.

Examples of the resin having a curable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

In the present invention, it is also preferable that MARPROOF G-0150M, G-0105SA, G-0130SP, G-0250SP, G-10055, G-1005SA, G-1010S, G-2050M, G-01100, or G-01758 (manufactured by NOF Corporation, an epoxy group-containing polymer), or ARTON F4520 (manufactured by JSR Corporation) is used as the resin.

The composition according to the embodiment of the present invention may include a resin as a dispersant. Examples of the dispersant include: a polymer dispersant (for example, a resin having an amine group (polyamideamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin polycondensate). In terms of a structure, the polymer dispersant can be further classified into a linear polymer, a terminal-modified polymer, a graft polymer, and a block polymer.

It is preferable that the dispersant is a resin that has a portion (hereinafter, collectively referred to as "adsorption portion") having an adsorption ability to particles is preferable. Examples of the adsorption portion include a monovalent substituent having at least one group selected from the group consisting of an acidic group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamide group, an alkoxysilyl group, an epoxy group, an isocyanate group, and a hydroxyl group. It is preferable that the adsorption portion is an acidic adsorption portion. Examples of the acidic adsorption portion include an acid group. In particular, it is preferable that the acidic adsorption portion is at least one of a phosphorus atom-containing group or a carboxyl group. Examples of the phosphorus atom-containing group include a phosphate group, a polyphosphate group, and a phosphate group. The details of the adsorption portion can be found in paragraphs "0073" to "0080" of JP2015-034691A, the content of which is incorporated herein by reference.

In the present invention, as the resin that is a dispersant, a dendrimer can be used. As the dendrimer, a resin represented by the following Formula (111) is preferable.

In Formula (111), $R^1$ represents a (m+n)-valent linking group, and $R^2$ represents a single bond or a divalent linking group. $A^1$ represents a monovalent substituent having at least one group selected from the group consisting of an acidic group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamide group, an alkoxysilyl group, an epoxy group, an isocyanate group, and a hydroxyl group. An n number of $A^1$'s and an n number of $R^2$'s may be the same as or different from each other. m represents a positive number of 8 or less, n represents 1 to 9, and m+n represents 3 to 10. $P^1$ represents a monovalent polymer chain. An m number of $P^1$'s may be the same as or different from each other.

Examples of the (m+n)-valent linking group represented by $R^1$ in Formula (111) include a group composed of 1 to 100 carbon atoms, 0 to 10 nitrogen atoms, 0 to 50 oxygen atoms, 1 to 200 hydrogen atoms, and 0 to 20 sulfur atoms. The details of the (m+n)-valent linking group can be found in paragraphs "0076" to "0084" of JP2007-277514A, the content is incorporated herein by reference.

It is preferable that the monovalent polymer chain represented by $P^1$ in Formula (111) is a monovalent polymer chain having a repeating unit derived from a vinyl compound. The details of the polymer chain can be found in paragraphs "0087" to "0098" of JP2007-277514A, the content is incorporated herein by reference.

Examples of the divalent linking group represented by $R^2$ in Formula (111) include a group composed of 1 to 100 carbon atoms, 0 to 10 nitrogen atoms, 0 to 50 oxygen atoms, 1 to 200 hydrogen atoms, and 0 to 20 sulfur atoms. The details of the divalent linking group can be found in paragraphs "0071" to "0075" of JP2007-277514A, the content is incorporated herein by reference.

The details of the monovalent substituent represented by $A^1$ in Formula (111) can be found in paragraphs "0041" to "0070" of JP2007-277514A, the content is incorporated herein by reference.

The details of the resin represented by Formula (111) can be found in paragraph "0039" of JP2007-277514A (corresponding to "0053" of US2010/0233595A), paragraphs "0081" to "0117" of JP2015-034961A, JP5909468B, JP5894943B, and JP5894944B, the contents of which are incorporated herein by reference. In addition, specific examples of the resin represented by Formula (111) include the following resin.

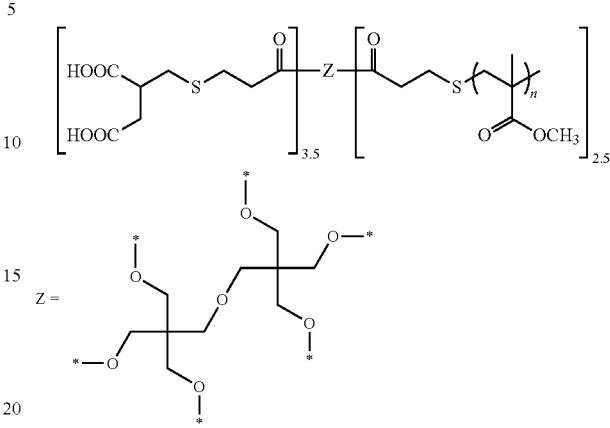

In the present invention, as the resin that is a dispersant, a graft copolymer including a repeating unit represented by any one of the following Formulae (11) to (14) can also be used.

In Formulae (11) to (14), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p represents 2 to 500, a plurality of $R^3$'s may be the same as or different from each other. In Formula (14), in a case where q represents 2 to 500, a plurality of $X^5$'s and a plurality of $R^4$'s may be the same as or different from each other.

The graft copolymer can be found in the description of paragraphs "0025" to "0094" of JP2012-255128A, the content of which is incorporated herein by reference. Specific examples of the graft copolymer include the following resins. In the following resins, a numerical value added to a main chain represents a molar ratio, and a numerical value added to a side chain represents the number of repeating units. Other examples of the graft copolymer include resins described in paragraphs "0072" to "0094" of JP2012-255128A, the content of which is incorporated herein by reference.

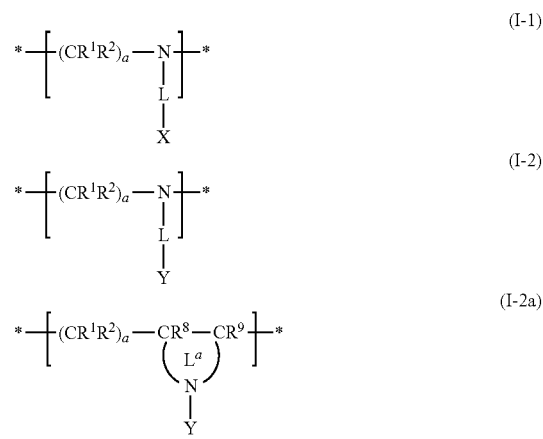

$R^1$, $R^2$, $R^8$, and $R^9$ each independently represent a hydrogen atom, a halogen atom, or an alkyl group (having preferably 1 to 6 carbon atoms).

a's each independently represent an integer of 1 to 5.

* represents a linking portion between repeating units.

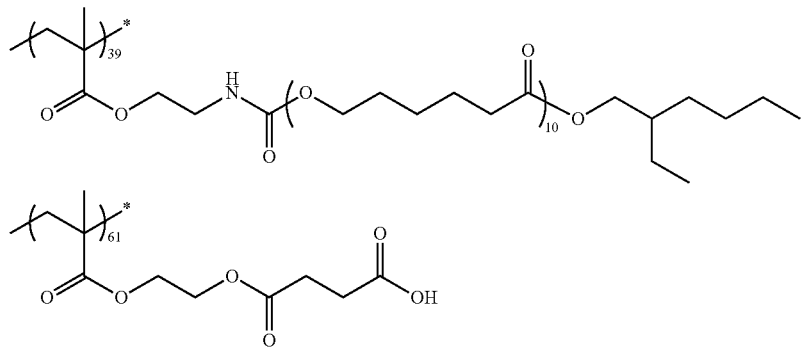

In addition, in the present invention, as the resin that is a dispersant, an oligoimine dispersant having a basic nitrogen atom at at least either a main chain or a side chain can also be used. As the oligoimine dispersant, a resin, which includes a repeating unit having a partial structure X with a functional group (pKa: 14 or lower) and side chains including an oligomer chain or polymer chain Y having 40 to 10000 atoms and has a basic nitrogen atom at at least either a main chain or a side chain, is preferable.

Here, the basic nitrogen atom is not particularly limited as long as it is a nitrogen atom exhibiting basicity. It is preferable that the resin has a structure having a nitrogen atom with a pKb of 14 or less, and it is more preferable that the resin has a structure having a nitrogen atom with a pKb of 10 or less. In the present invention, pKb (basic strength) refers to a pKb at a water temperature of 25° C., is one of the indices for quantitatively representing the strength of a base, and is the same as the basicity constant. The basic strength pKb and the acid strength pKa have a relationship of pKb=14-pKa.

Examples of the oligoimine dispersant include a resin including at least one of a repeating unit represented by Formula (I-1), a repeating unit represented by Formula (I-2), or a repeating unit represented by Formula (I-2a).

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. It is preferable that L represents a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms), and $R^7$ represents a hydrogen atom or an alkyl group having 1 to 6 carbon atoms.

$L^a$ is a structural unit which forms a ring structure with $CR^8CR^9$ and N and preferably a structural unit which forms a nonaromatic heterocycle having 3 to 7 carbon atoms with $CR^8CR^9$ and a carbon atom.

X represents a group having a functional group (pKa: 14 or lower).

Y represents an oligomer chain or a polymer chain having 40 to 10000 atoms.

The dispersant (oligoimine dispersant) may further include one or more copolymerization components selected from the group consisting of the repeating unit represented by Formulae (I-3), (I-4), and (I-5). By the dispersant including the above-described repeating units, the dispersibility of the particles can be further improved.

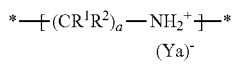

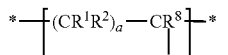

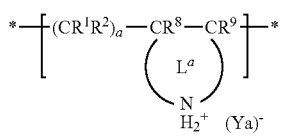

$R^1$, $R^2$, $R^8$, $R^9$, L, $L^a$, a, and * have the same definitions as $R^1$, $R^2$, $R^8$, $R^9$, L, $L^a$, a, and * in Formulae (I-1), (I-2), and (I-2a). Ya represents a side chain having 40 to 10000 atoms which has an anionic group.

The oligoimine dispersant can be found in the description of paragraphs "0118" to "0190" of JP2015-034961A, the content of which is incorporated herein by reference. Specific examples of the oligoimine dispersant which can be used include the following resins and a resin described in paragraphs "0169" to "0190" of JP2015-034961A. In the following formulae, a numerical value added to a main chain represents a molar ratio, and a numerical value added to a side chain represents the number of repeating units.

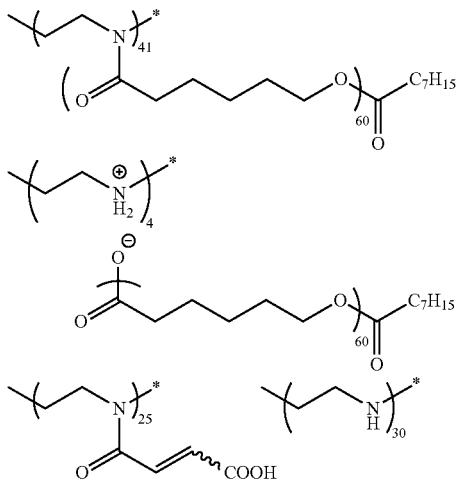

In addition, the dispersant is available as a commercially available product, and specific examples thereof include DISPERBYK series (for example, DISPERBYK 103 and 111, manufactured by BYK Chemie). In addition, a pigment dispersant described in paragraphs "0041" to "0130" of JP2014-130338A can also be used, the content of which is incorporated herein by reference. In addition, the resin having an acid group or the like can also be used as a dispersant.

In the composition according to the embodiment of the present invention, the content of the resin is preferably 1 to 99.9 mass % with respect to the total solid content of the composition. The lower limit is preferably 20 mass % or higher and more preferably 30 mass % or higher. The upper limit is preferably 90 mass % or lower and more preferably 80 mass % or lower.

In a case where the high refractive index resin is used as the resin, only the high refractive index resin may be used as the resin, or the high refractive index resin and a resin having a refractive index of lower than 1.7 to near infrared light may be used in combination. In addition, the content of the high refractive index resin is preferably 1 to 100 mass % and more preferably 10 to 100 mass % with respect to the total amount of the resins.

In the composition according to the embodiment of the present invention, the content of the dispersant is preferably 1 to 80 mass % with respect to the total solid content of the composition. The upper limit is preferably 70 mass % or lower and more preferably 60 mass % or lower. The lower limit is preferably 3 mass % or higher and more preferably 5 mass % or higher. In addition, the content of the dispersant is preferably 1 to 200 parts by mass with respect to 100 parts by mass of the particles. The upper limit is preferably 100 parts by mass or less and more preferably 50 parts by mass or less. The lower limit is preferably 3 parts by mass or more and more preferably 5 parts by mass or more.

The composition may include one resin or two or more resins.

<<Solvent>>

It is preferable that the composition according to the embodiment of the present invention includes a solvent. The solvent can be formed of various organic solvents. Examples of the organic solvent include esters, ethers, ketones, and aromatic hydrocarbons. Specific examples of the organic solvent include methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate. The details of the organic solvent can be found in paragraph "0223" of WO2015/166779A, the content of which is incorporated herein by reference. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

Among these organic solvents, one kind may be used alone, or two or more kinds may be used in combination. In a case where two or more organic solvents are used in combination, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 1 to 90 mass % with respect to the solid content concentration of the composition. The upper limit is more preferably 80 mass % or lower. The lower limit is more preferably 10 mass % or higher.

In addition, in a case where the high refractive index member IR having a lens shape is manufactured with a transfer method using the composition according to the embodiment of the present invention (composition for forming a high refractive index member), the content of the solvent is preferably 10 to 70 mass % with respect to the solid content concentration of the composition. The upper limit is more preferably 60 mass % or lower. The lower limit is more preferably 15 mass % or higher.

<<Curable Compound>>

It is preferable that the composition according to the embodiment of the present invention includes a curable compound. As the curable compound, a well-known compound which is curable by a radical, an acid, or heat can be used. Examples of the curable compound include a compound which has a group having an ethylenically unsaturated bond, a compound having an epoxy group, and a compound having a methylol group. Examples of the group having an ethylenically unsaturated bond include a vinyl group, a (meth)allyl group, a (meth)acryloyl group, and a (meth)acryloyloxy group. Among these, a (meth)acryloyl group or a (meth)acryloyloxy group is preferable. The curable compound is preferably a polymerizable compound and more preferably a radically polymerizable compound. Examples of the polymerizable compound include a compound which has a group having an ethylenically unsaturated bond.

The content of the curable compound is preferably 1 to 80 mass % with respect to the total solid content of the composition. The lower limit is preferably 3 mass % or higher and more preferably 5 mass % or higher. The upper limit is more preferably 70 mass % or lower, and still more preferably 60 mass % or lower. As the curable compound, one kind may be used alone, or two or more kinds may be used in combination. In a case where two or more polymerizable compounds are used in combination, it is preferable that the total content of the two or more polymerizable compounds is in the above-described range.

(Compound which has Group Having Ethylenically Unsaturated Bond (Polymerizable Compound))

In the present invention, as the curable compound, a compound which has a group having an ethylenically unsaturated bond (hereinafter, also referred to as "polymerizable compound") can be used. It is preferable that the polymerizable compound is a monomer. The molecular weight of the polymerizable compound is preferably 100 to 3000. The upper limit is preferably 2000 or lower and more preferably 1500 or lower. The lower limit is preferably 150 or higher and more preferably 250 or higher. The polymerizable compound is preferably a (meth)acrylate compound having 3 to 15 functional groups and more preferably a (meth)acrylate compound having 3 to 6 functional groups.

Examples of the polymerizable compound can be found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfo group, or a phosphate group. Examples of the polymerizable compound having an acid group include an ester of an aliphatic polyhydroxy compound and an unsaturated carboxylic acid. A polymerizable compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol and/or dipentaerythritol. Examples of a commercially available product of the polymerizable compound having an acid group include M-305, M-510, and M-520 of ARONIX series as polybasic acid-modified acrylic oligomer (manufactured by Toagosei Co., Ltd.). The acid value of the polymerizable compound having an acid group is preferably 0.1 to 40 mgKOH/g. The lower limit is preferably 5 mgKOH/g or higher. The upper limit is preferably 30 mgKOH/g or lower.

In addition, it is also preferable that the polymerizable compound is a compound having a caprolactone structure. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the polymerizable compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARAD DPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

The content of the polymerizable compound is preferably 1 to 80 mass % with respect to the total solid content of the composition. The lower limit is preferably 3 mass % or higher and more preferably 5 mass % or higher. The upper limit is more preferably 70 mass % or lower, and still more preferably 60 mass % or lower.

(Compound Having Epoxy Group)

In the present invention, as the curable compound, a compound having an epoxy group can also be used. Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit is, for example, 10 or less or 5 or less. The lower limit is preferably 2 or more.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

As the compound having an epoxy group, a commercially available product can also be used. Examples of the commercially available product include "EHPE3150" (manufactured by Daicel Corporation) and "EPICLON N-695" (manufactured by DIC Corporation). In addition, as the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference.

The content of the compound having an epoxy group is preferably 1 to 80 mass % with respect to the total solid content of the composition. The lower limit is preferably 3 mass % or higher and more preferably 5 mass % or higher. The upper limit is preferably 70 mass % or lower, and more preferably 60 mass % or lower. As the compound having an epoxy group, one kind may be used alone, or two or more kinds may be used. In a case where two or more compounds having an epoxy group are used in combination, it is preferable that the total content of the two or more compounds having an epoxy group is in the above-described range.

<<Photopolymerization Initiator>>

The composition according to the embodiment of the present invention may include a photopolymerization initiator. In particular, in a case where the composition according to the embodiment of the present invention includes the radically polymerizable compound, it is preferable that the composition includes a photopolymerization initiator. The photopolymerization initiator is not particularly limited and can be appropriately selected from well-known photopolymerization initiators. For example, a compound having photosensitivity to light in a range from an ultraviolet range to a visible range is preferable. It is preferable that the photopolymerization initiator is a photoradical polymerization initiator.

Examples of the photopolymerization initiator include: a halogenated hydrocarbon derivative (For example, a compound having a triazine skeleton or a compound having an oxadiazole skeleton); an acylphosphine compound such as acylphosphine oxide; hexaarylbiimidazole; an oxime compound such as an oxime derivative; an organic peroxide, a thio compound, a ketone compound, an aromatic onium salt, keto oxime ether, an aminoacetophenone compound, and hydroxyacetophenone. In addition, from the viewpoint of exposure sensitivity, as the photopolymerization initiator, a compound selected from the group consisting of a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxy ketone compound, an α-amino ketone compound, and an acylphosphine compound is more preferable, and an oxime compound is still more preferable. The details of the photopolymerization initiator can be found in paragraphs "0065" to "0111" of JP2014-130173A.

As the photopolymerization initiator, an α-hydroxyketone compound, an α-aminoketone compound, or an acylphosphine compound can also be preferably used. For example, an α-aminoketone compound described in JP1998-291969A (JP-H10-291969A) or an acylphosphine compound described in JP4225898B can also be used. Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE). Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), and ADEKA OPTOMER N-1919 (manufactured by Adeka Corporation, a photopolymerization initiator 2 described in JP2012-014052A).

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The contents are incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by Adeka Corporation).

Hereinafter, specific examples of the oxime compound which are preferably used in the present invention are shown below, but the present invention is not limited thereto.

(C-1)

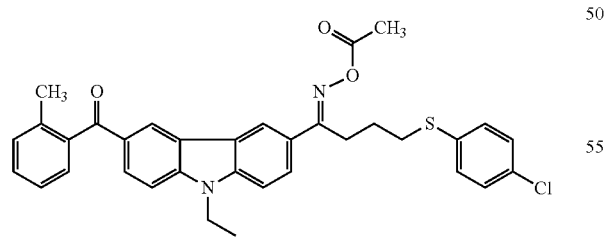

(C-2)

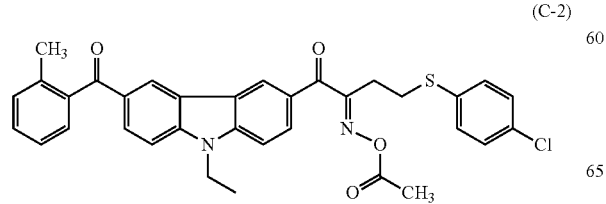

(C-3)

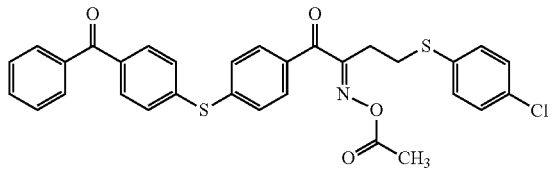

(C-4)

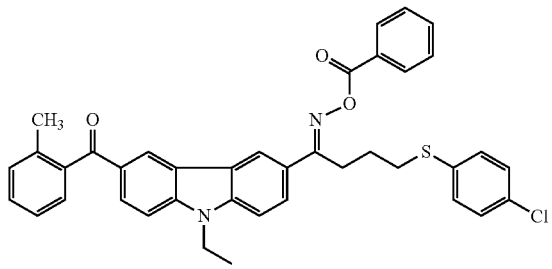

(C-5)

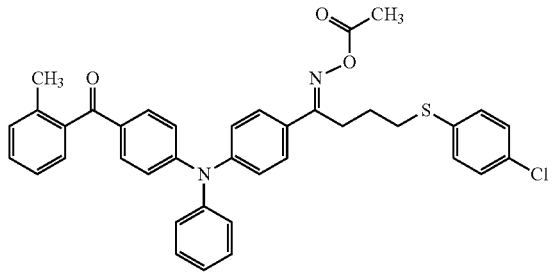

(C-6)

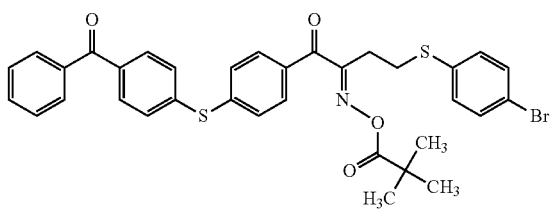

(C-7)

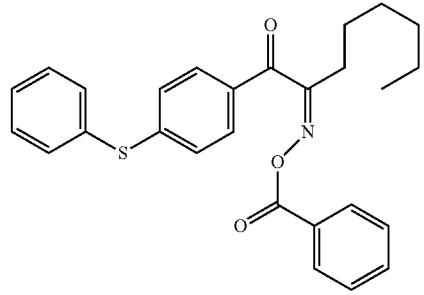

(C-8)

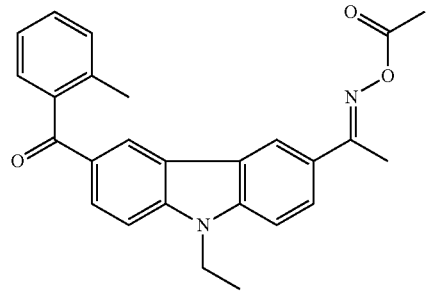

-continued (C-9)
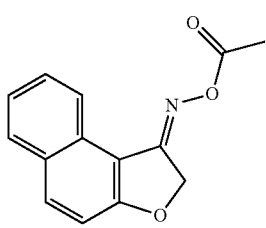

(C-14)
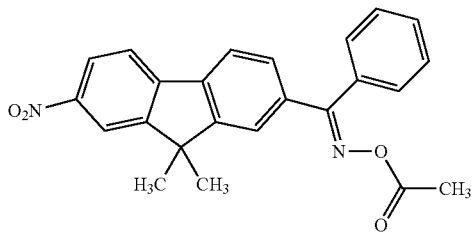

(C-10)
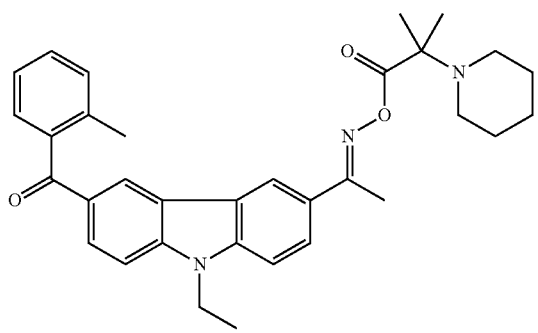

(C-11)
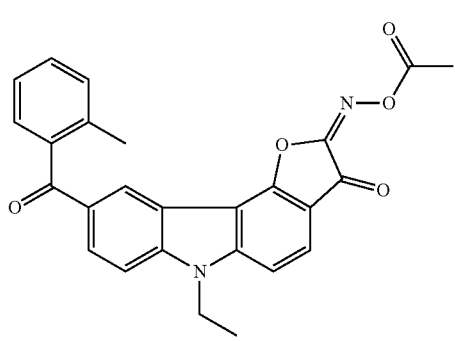

(C-12)
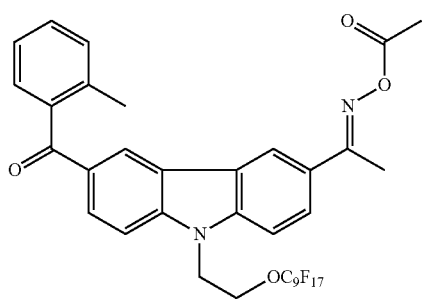

(C-13)
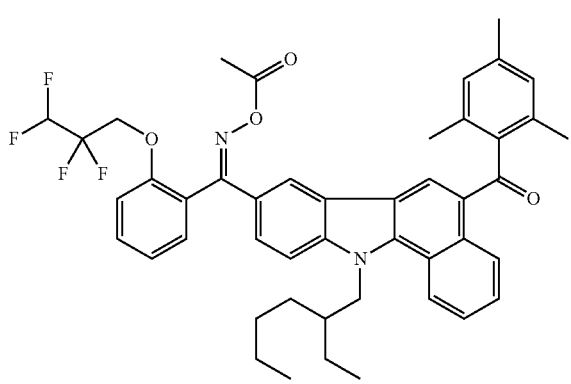

The oxime compound is preferably a compound having an absorption maximum in a wavelength range of 350 nm to 500 nm and more preferably a compound having an absorption maximum in a wavelength range of 360 nm to 480 nm. In addition, the oxime compound is preferably a compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the molar absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, higher sensitivity and pattern formability can be obtained. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

<<Antioxidant>>

The composition according to the present invention may include an antioxidant. Examples of the antioxidant include a phenol compound, a phosphite compound, and a thioether compound. As the antioxidant, a phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used, and a polysubstituted phenol compound is preferable. The polysubstituted phenol compound can be roughly classified into three types (a hindered type, a semi-hindered type, and a less-hindered type) having different substitution sites and structures. In addition, as the antioxidant, a compound having a phenol group and a phosphite group in the same molecule can be preferably used. In addition, as the antioxidant, a phosphorus antioxidant can also be preferably used. As the antioxidant, a commercially available product can also be used. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). In addition, the details of the antioxidant can be found in paragraphs "0033" to "0043" of JP2014-032380A, the content of which is incorporated herein by reference.

The content of the antioxidant is preferably 0.01 to 20 mass % and more preferably 0.3 to 15 mass % with respect to the total solid content of the composition. As the antioxidant, one kind may be used alone, or two or more kinds may be used. In a case where two or more antioxidants are used in combination, it is preferable that the total content of the two or more antioxidants is in the above-described range.

<<Silane Coupling Agent>>

The composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group is a group which interacts with the resin or forms a bond with the resin to exhibit affinity. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable.

Specific examples of the silane coupling agent include 3-methacryloxypropylmethyldimethoxysilane. In addition, examples of the silane coupling agent include a compound described in paragraphs "0018" to "0036" of JP2009-288703A and a compound described in paragraphs "0056" to "0066" of JP2009-242604A, the content of which is incorporated herein by reference. As the silane coupling agent, a commercially available product can also be used. Examples of the commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBM-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more silane coupling agents are used in combination, it is preferable that the total content of the two or more silane coupling agents is in the above-described range.

<<Polymerization Inhibitor>>

The composition according to the present invention may include a polymerization inhibitor. Examples of the polymerization inhibitor include hydroquinone, p-methoxyphenol, di-t-butyl-p-cresol, pyrogallol, tert-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The polymerization inhibitor may also function as an antioxidant.

The content of the polymerization inhibitor is preferably 0.01 parts by mass to 10 parts by mass, more preferably 0.01 to 8 parts by mass, and most preferably 0.01 to 5 parts by mass with respect to 100 parts by mass of the photopolymerization initiator.

<<Surfactant>>

The composition according to the embodiment of the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

By the composition according to the embodiment of the present invention containing a fluorine surfactant, liquid characteristics (for example, fluidity) of a coating solution prepared from the coloring composition are further improved, and the uniformity in coating thickness and liquid saving properties can be further improved. In a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/17669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PolyFox PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

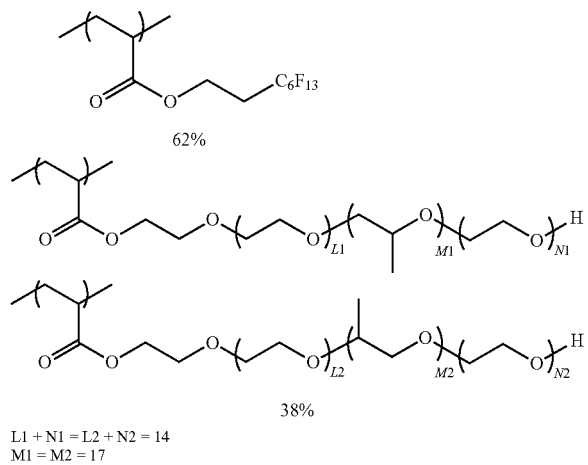

L1 + N1 = L2 + N2 = 14
M1 = M2 = 17

The weight-average molecular weight of the compound is preferably 3000 to 50000 and, for example, 14000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil & Fat Co., Ltd.), and OLFINE E1010, SUR-FYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the composition. As the surfactant, one kind may be used alone, or two or more kinds may be used. In a case where two or more surfactants are used in combination, it is preferable that the total content of the two or more surfactants is in the above-described range.

<<Ultraviolet Absorber>>

The composition according to the embodiment of the present invention may include an ultraviolet absorber. As the ultraviolet absorber, a conjugated diene compound, an amino diene compound, a salicylate compound, a benzophenone compound, a benzotriazole compound, an acrylonitrile compound, a hydroxyphenyltriazine compound an indole compound, or a triazine compound can be used. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil & Fat Co., Ltd.; The Chemical Daily, Feb. 1, 2016) may be used. Specific examples of the ultraviolet absorber include compounds having the following structures.

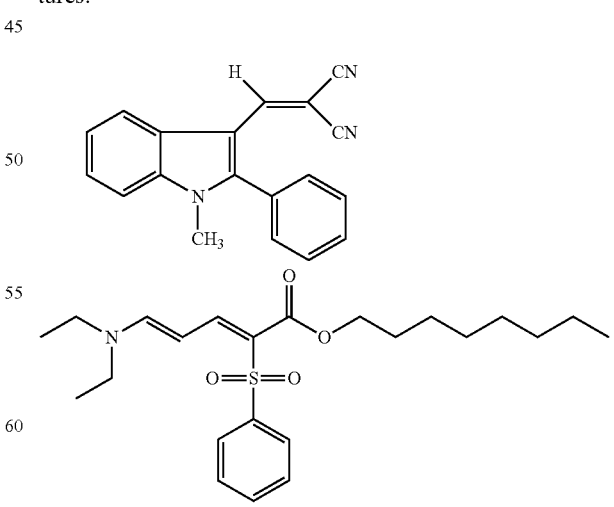

The content of the ultraviolet absorber is preferably 0.1 to 10 mass %, more preferably 0.1 to 5 mass %, and still more preferably 0.1 to 3 mass % with respect to the total solid content of the composition. As the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Other Components>>

The composition according to the embodiment of the present invention may include various additives, for example, a thermal polymerization initiator, a thermal polymerization component, a plasticizer, a developability improving agent such as a low molecular weight organic carboxylic acid, a filler, or an aggregation inhibitor.

<Method of Preparing Composition>

The composition according to the embodiment of the present invention can be prepared by mixing the above-described components with each other. During the preparation of the composition, the respective components may be mixed with each other collectively, or may be mixed with each other sequentially after dissolved and dispersed in a solvent. For example, all the components may be dissolved or dispersed in an organic solvent at the same time to prepare the composition. In addition, the composition can also be prepared by dispersing the particles in the solvent and the resin to prepare a dispersion and mixing the dispersion with other components (for example, a binder or a curable compound).

In a case where the composition according to the embodiment of the present invention includes particles, it is preferable that a method of preparing the composition includes a process of dispersing the particles. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more. In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation. The second filter may be formed of the same material as that of the first filter. In addition, the filtering using the first filter may be performed only on the dispersion, and the filtering using the second filter may be performed on a mixture of the dispersion and other components.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

<Method of Measuring Acid Value>

A measurement sample was dissolved in a mixed solvent including tetrahydrofuran and water at 9/1 (mass ratio) to prepare a measurement solution. The obtained measurement solution was neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A = 56.11 \times Vs \times 0.5 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (expressed in terms of solid contents)

<Method of Measuring Weight-Average Molecular Weight>

In the measurement of the weight-average molecular weight, HPC-8220GPC (manufactured by Tosoh Corporation) was used as a measuring device, TSK guard column Super HZ-L was used as a guard column, a column in which Tsk gel Super HZM-M, TSK gel Super HZ4000, TSK gel Super HZ3000, and TSK gel Super HZ2000 were connected in series was used as a column, and the column temperature was set as 40° C. Under the above-described conditions, 10 μL of a tetrahydrofuran solution (sample concentration: 0.1 mass %) was injected, tetrahydrofuran as an elution solvent was caused to flow at a flow rate of 0.35 mL per minute, a sample peak was detected using a differential refractive index (RI) detector, and the weight-average molecular weight was calculated from a calibration curve prepared using standard polystyrene.

<Preparation of Dispersion 1>

By using ULTRA APEX MILL (manufactured by Kotobuki Industries Co., Ltd.) as a circulation type dispersion apparatus (beads mill), a mixed solution having the following composition was dispersed to obtain a dispersion 1.

(Composition of Mixed Solution)

| | |
|---|---|
| Phthalocyanine pigment (a compound having a structure in which $X^1$ to $X^{16}$ in Formula (PC-1) represents a hydrogen atom; average primary particle size: 50 nm) | 18 parts by mass |
| Resin A | 6.7 parts by mass |
| Cyclohexanone | 75.3 parts by mass |

Resin A: a 30 mass % propylene glycol methyl ether acetate solution of a resin having the following structure (in the formula, n represents 14; weight-average molecular weight: 6400; acid value: 80 mgKOH/g; the resin having the following structure was synthesized using a synthesis method described in paragraphs "0114" to "0140" and "0266" to "0348" of JP2007-277514A)

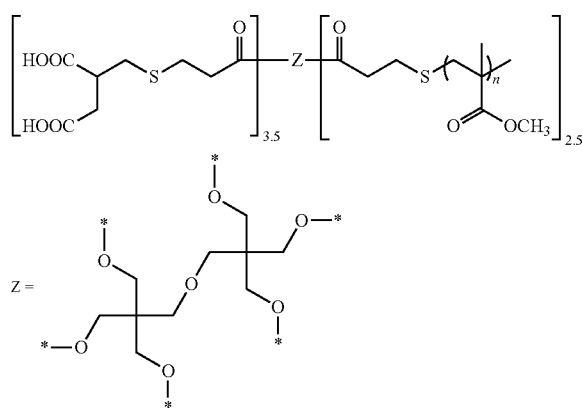

The dispersion apparatus operated under the following conditions.

Bead diameter: 0.05 mm
Bead filling rate: 75 vol %
Circumferential speed: 10 m/sec
Pump supply rate: 10 kg/hr
Cooling water: tap water
Inner volume of circular path of beads mill: 0.15 L
Amount of mixed Solution to be dispersed: 0.7 kg <Preparation of Dispersion 2>

A dispersion 2 was prepared using the same method as that of the dispersion 1, except that the following mixed solution was used.

(Composition of Mixed Solution)

| | |
|---|---|
| Phthalocyanine pigment (average primary particle size: 50 nm) | 18 parts by mass |
| Resin B | 6.7 parts by mass |
| Propylene Glycol Methyl Ether Acetate (PGMEA) | 75.3 parts by mass |

Resin B: a 30 mass % PGMEA solution of a resin having the following structure (weight-average molecular weight: 24000; acid value: 53 mgKOH/g; a numerical value added to a repeating unit represents a molar ratio, and a numerical value added to a side chain represents the number of repeating units)

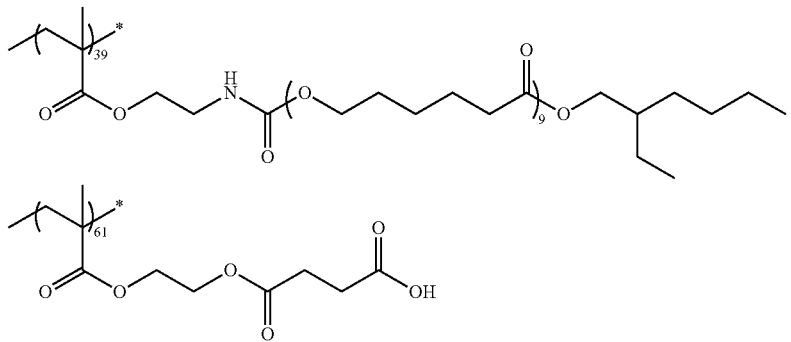

<Preparation of Dispersions 3 to 36>

Dispersions 3 to 36 were prepared using the same method as that of the dispersion 1, except that the kinds of the particles and the resin were changed as shown below.

TABLE 1

| | Particles | | |
|---|---|---|---|
| Dispersion Kind | | Average Primary Particle Size (nm) | Resin |
| 3 | Phthalocyanine | 50 | Resin C |
| 4 | Phthalocyanine | 50 | Resin D |
| 5 | Phthalocyanine | 50 | Resin E |
| 6 | Phthalocyanine | 50 | Resin F |
| 7 | Phthalocyanine | 50 | Resin A/ Resin B = 1/ 1 (Mass Ratio) |
| 8 | Lithium Phthalocyanine | 70 | Resin C |

TABLE 1-continued

| | | Particles | |
|---|---|---|---|
| Dispersion | Kind | Average Primary Particle Size (nm) | Resin |
| 9 | Sodium Phthalocyanine | 50 | Resin C |
| 10 | Magnesium Phthalocyanine | 50 | Resin C |
| 11 | Chloroaluminum Phthalocyanine | 50 | Resin C |
| 12 | Silicon Dichloride Phthalocyanine | 50 | Resin C |
| 13 | Titanium Phthalocyanine | 50 | Resin C |
| 14 | Vanadium Oxide Phthalocyanine | 50 | Resin C |
| 15 | Manganese Phthalocyanine | 50 | Resin C |
| 16 | Iron Phthalocyanine | 50 | Resin C |
| 17 | Cobalt Phthalocyanine | 50 | Resin C |
| 18 | Nickel Phthalocyanine | 70 | Resin C |
| 19 | α-Type Copper Phthalocyanine | 50 | Resin C |
| 20 | β-Type Copper Phthalocyanine | 50 | Resin C |
| 21 | ε-Type Copper Phthalocyanine | 50 | Resin C |
| 22 | Zinc Phthalocyanine | 50 | Resin C |
| 23 | Tin Phthalocyanine | 50 | Resin C |
| 24 | Tin Dichloride Phthalocyanine | 50 | Resin C |
| 25 | Lead Phthalocyanine | 50 | Resin C |
| 26 | Platinum Phthalocyanine | 50 | Resin C |
| 27 | PB15:6 | 50 | Resin C |
| 28 | PG7 | 50 | Resin C |
| 29 | PG36 | 50 | Resin C |
| 30 | PG58 | 50 | Resin C |
| 31 | Nitrile Phthalocyanine | 50 | Resin C |
| 32 | Naphthalocyanine | 50 | Resin C |
| 33 | εFe$_2$O$_3$ | 50 | Resin C |
| 34 | BaFe | 50 | Resin C |
| 35 | SrFe | 50 | Resin C |
| 36 | TiO$_2$ | 50 | Resin C |

In the table, PB 15:6 represents C.I. Pigment Blue 15:6. In addition, PG7 represents C.I. Pigment Green 7. In addition, PG36 represents C.I. Pigment Green 36. In addition, PG58 represents C.I. Pigment Green 58.

As a resin C, DISPERBYK 103 (manufactured by BYK Chemie) was used.

As a resin D, a 30 mass % PGMEA solution of a resin having the following structure was used. The weight-average molecular weight of the resin having the following structure is 23000. A numerical value added to a repeating unit represents a molar ratio, and a numerical value added to a side chain represents the number of repeating units.

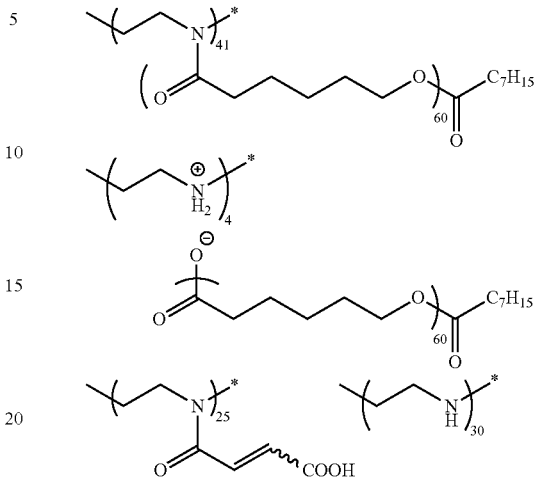

As a resin E, DISPERBYK 111 (manufactured by BYK Chemie) was used.

As a resin F, a 44 mass % PGMEA solution of a resin having the following structure was used. The weight-average molecular weight of the resin having the following structure is 40000. A numerical value added to a repeating unit represents a molar ratio.

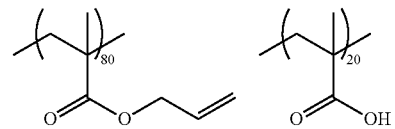

Preparation of Composition

Example 1

A composition according to Example 1 was prepared by mixing the following components with each other.

| | |
|---|---|
| Dispersion 1 | 50 parts by mass |
| Alkali-soluble resin 1 (44 mass % PGMEA solution of a resin having the following structure; the weight-average molecular weight of the resin having the following structure represents 5000; A numerical value added to a repeating unit represents a molar ratio) | 11 parts by mass |

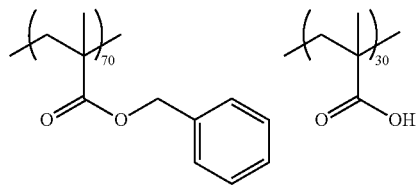

| | |
|---|---|
| Polymerizable compound (ARONIX M-510, manufactured by Toagosei Co., Ltd.) | 3 parts by mass |
| Photopolymerization initiator (IRGACURE-OXE01, manufactured by BASF SE) | 1 part by mass |
| Surfactant (the following mixture, weight-average molecular weight = 14000, "%" representing the proportion of a repeating unit is mol %) | 0.04 parts by mass |

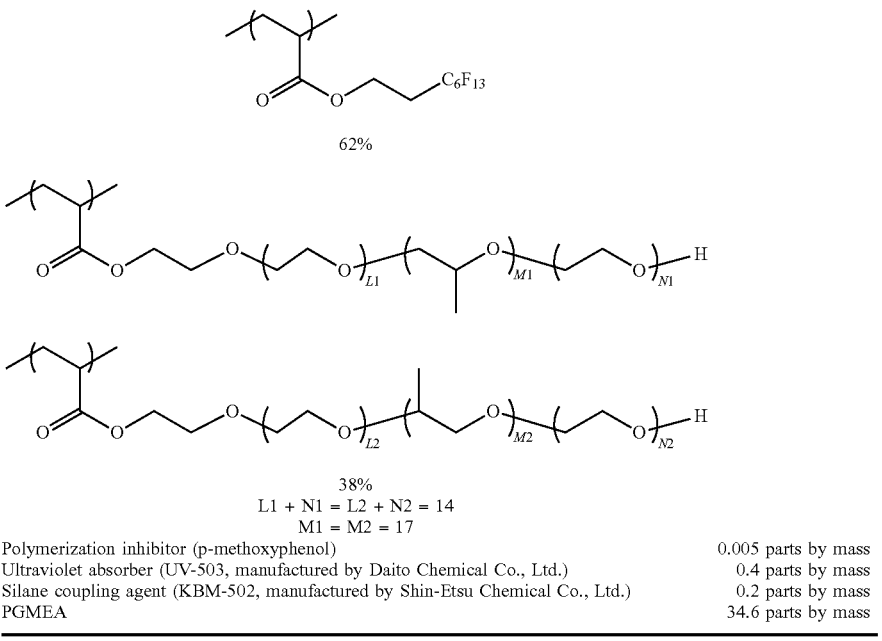

38%
L1 + N1 = L2 + N2 = 14
M1 = M2 = 17

| | |
|---|---|
| Polymerization inhibitor (p-methoxyphenol) | 0.005 parts by mass |
| Ultraviolet absorber (UV-503, manufactured by Daito Chemical Co., Ltd.) | 0.4 parts by mass |
| Silane coupling agent (KBM-502, manufactured by Shin-Etsu Chemical Co., Ltd.) | 0.2 parts by mass |
| PGMEA | 34.6 parts by mass |

Examples 2 to 35

Compositions according to Examples 2 to 35 were prepared using the same method as that of Example 1, except that the dispersions 2 to 35 were used instead of the dispersion 1.

Example 36

A composition according to Example 36 was prepared using the same method as that of Example 1, except that 25 parts by mass of the dispersion 1 and 25 parts by mass of the dispersion 2 were used instead of 50 parts by mass of the dispersion 1.

Example 37

A composition according to Example 37 was prepared using the same method as that of Example 1, except that 5.5 parts by mass of the alkali-soluble resin 1 and 5.5 parts by mass of the resin F were used instead of 11 parts by mass of the alkali-soluble resin 1.

Example 38

A composition according to Example 38 was prepared using the same method as that of Example 1, except that 1.5 parts by mass of ARONIX M-510 (manufactured by Toagosei Co., Ltd.) and 1.5 parts by mass of KAYARAD DPHA (manufactured by Nippon Kayaku Co., Ltd.) were used in combination as the polymerizable compound.

Example 39

A composition according to Example 39 was prepared using the same method as that of Example 1, except that 0.34 parts by mass of IRGACURE-OXE01 (manufactured by BASF SE), 0.33 parts by mass of IRGACURE-OXE03 (manufactured by BASF SE), and 0.33 parts by mass of IRGACURE-369 (manufactured by BASF SE) were used as the photopolymerization initiator.

Example 40

A composition according to Example 40 was prepared using the same method as that of Example 1, except that 5.5 parts by mass of the alkali-soluble resin 1 and 5.5 parts by mass of the resin F were used instead of 11 parts by mass of the alkali-soluble resin 1.

Comparative Example 1

A compositions according to Comparative Example 1 was prepared using the same method as that of Example 1, except that the dispersion 36 was used instead of the dispersion 1.

<Evaluation of Spectral Characteristics>

Each of the compositions was applied to a glass substrate using a spin coating method such that the thickness of the heated film was 1.0 μm, was dried using a hot plate at 100° C. for 120 seconds, and was further heated at 200° C. for 300 seconds. As a result, a film was prepared.

The absorbance of the glass substrate including the film in a wavelength range of 300 to 2500 nm was measured using U-4150 (manufactured by Hitachi High-Technologies Corporation). For reference, a glass substrate was used. A maximum value B of an absorbance in a wavelength range of 400 nm or longer and shorter than 800 nm to a maximum value A of an absorbance in a wavelength range of 800 nm to 2000 nm were measured to calculate an absorbance ratio (B/A).

A: the absorbance ratio (B/A) was 1.0 or higher
B: the absorbance ratio (B/A) was lower than 1.0

<Measurement of Refractive Index>

Each of the compositions was applied to a silicon wafer and was heated at 200° C. for 5 minutes to form a film having a thickness of 0.1 μm. As a result, a measurement sample was prepared. Regarding the prepared measurement sample, refractive indices were measured in a wavelength range of 300 to 1500 nm using VASE (manufactured by J. A. Woollam Co., Inc.) to obtain a refractive index n810 at a wavelength of 810 nm, a refractive index n850 at a wavelength of 850 nm, and a refractive index n940 at a wavelength of 940 nm.

A: the refractive index was 1.9 or higher

B: the refractive index was 1.8 or higher and lower than 1.9

C: the refractive index was 1.7 or higher and lower than 1.8

D: the refractive index was lower than 1.7

TABLE 2

| | Absorbance Ratio (B/A) | n810 | n850 | n940 |
|---|---|---|---|---|
| Example 1 | A | C | C | C |
| Example 2 | A | C | C | C |
| Example 3 | A | C | C | C |
| Example 4 | A | C | C | C |
| Example 5 | A | C | C | C |
| Example 6 | A | C | C | C |
| Example 7 | A | C | C | C |
| Example 8 | A | A | A | A |
| Example 9 | A | A | A | A |
| Example 10 | A | A | A | A |
| Example 11 | A | A | A | A |
| Example 12 | A | A | A | A |
| Example 13 | A | A | A | A |
| Example 14 | A | A | A | A |
| Example 15 | A | A | A | A |
| Example 16 | A | A | A | A |
| Example 17 | A | A | A | A |
| Example 18 | A | A | A | A |
| Example 19 | A | B | B | B |
| Example 20 | A | B | B | B |
| Example 21 | A | B | B | B |
| Example 22 | A | B | B | B |
| Example 23 | A | A | A | A |
| Example 24 | A | A | A | A |
| Example 25 | A | A | A | A |
| Example 26 | A | A | A | A |
| Example 27 | A | B | B | B |
| Example 28 | A | C | C | C |
| Example 29 | A | C | C | C |
| Example 30 | A | C | C | C |
| Example 31 | A | B | B | B |
| Example 32 | A | B | B | B |
| Example 33 | A | B | B | B |
| Example 34 | A | B | B | B |
| Example 35 | A | B | B | B |
| Example 36 | A | C | C | C |
| Example 37 | A | C | C | C |
| Example 38 | A | C | C | C |
| Example 39 | A | C | C | C |
| Example 40 | A | C | C | C |
| Comparative Example 1 | A | D | D | D |

As shown in the table, Examples had characteristics in which the transmittance to near infrared light was high, and the refractive index to near infrared light was 1.7 or higher.

Example 101

A composition 1 for forming a near infrared transmitting filter was applied to a silicon wafer using a spin coating method. Next, the silicon wafer was heated using a hot plate at 100° C. for 2 minutes. As a result, a cured composition layer having a thickness of 1.7 µm was formed. Next, a 2 µm×2 µm island pattern (near infrared transmitting filter) was formed on the cured composition layer using a dry etching method.

Next, the composition 1 for forming a near infrared cut filter was applied using a spin coating method such that the thickness of the post-baked film was 0.85 µm. Next, the silicon wafer was heated using a hot plate at 100° C. for 2 minutes. Next, using an i-ray stepper exposure device FPA-3000 i5+(manufactured by Canon Corporation), a region other than the near infrared transmitting filter was exposed through a mask at an exposure dose of 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated (post-baked) using a hot plate at 200° C. for 5 minutes. As a result, a pattern (near infrared cut filter) was formed.

Next, a Red composition 1 was applied to the near infrared cut filter using a spin coating method such that the thickness of the post-baked film was 0.85 µm. Next, the silicon wafer was heated using a hot plate at 100° C. for 2 minutes. Next, using an i-ray stepper exposure device FPA-3000 i5+(manufactured by Canon Corporation), the silicon wafer 1 was exposed through a mask having a 2 µm×2 µm Bayer pattern at an exposure dose of 1000 mJ/cm$^2$. Next, puddle development was performed at 23° C. for 60 seconds using a tetramethylammonium hydroxide (TMAH) 0.3 mass % aqueous solution. Next, the silicon substrate was rinsed by spin showering and was cleaned with pure water. Next, the silicon wafer was heated (post-baked) using a hot plate at 200° C. for 5 minutes. As a result, the Red composition 1 was patterned on the near infrared cut filter. Likewise, a Green composition 1 and a Blue composition 1 were sequentially patterned to color filters of the respective colored pixels.

Next, the composition according to Example 1 was applied to the near infrared transmitting filter, and a microlens was formed using the above-described transfer method. A microlens was formed on the color filters using a well-known high refractive index resin with the above-described method. As a result, a structure according to Example 101 was manufactured.

Examples 102 to 140

Structures according to Examples 102 to 140 were manufactured using the same method as that of Example 101, except that microlenses were formed by using the compositions according to Examples 2 to 40 instead of the composition according to Example 1.

Comparative Example 101

A structure according to Comparative Example 101 was manufactured using the same method as that of Example 101, except that a microlens was formed by using the composition according to Comparative Example 101 instead of the composition according to Example 1.

<Evaluation>

Each of the structures according to Examples 101 to 140 and Comparative Example 101 was incorporated into a solid image pickup element according to a well-known method to manufacture an infrared sensor. Regarding this infrared sensor, a subject was irradiated with light emitted from an infrared light emitting diode (infrared LED) light source in a low-illuminance environment (0.001 Lux) to acquire images. Next, the imaging performance of the solid image pickup element was evaluated. In the infrared sensors formed of the structures according to Examples 101 to 140, the subject was able to be recognized on the image more clearly than in the infrared sensor formed of the structure according to Comparative Example 101.

The composition 1 for forming a near infrared transmitting filter, the composition 1 for forming a near infrared cut filter, the Red composition 1, the Green composition 1, and the Blue composition 1 used in Examples 101 are as follows.

[Composition 1 for Forming Near Infrared Transmitting Filter]

| | |
|---|---|
| Pigment Dispersion 1 | 28 parts by mass |
| Pigment Dispersion 2 | 38 parts by mass |
| Pigment Dispersion 3 | 15 parts by mass |
| Pigment Dispersion 4 | 5 parts by mass |
| Pigment Dispersion 5 | 10 parts by mass |
| Polymerizable compound (KAYARAD DPHA, manufactured by Nippon Kayaku Co., Ltd.) | 0.4 parts by mass |

The pigment dispersions 1 to 5 were prepared by mixing and dispersing components show below in tables using a beads mill for 15 hours.

TABLE 3

| | Pigment | | Resin | | | | Solvent | |
|---|---|---|---|---|---|---|---|---|
| | Kind | Mass % | Kind | Mass % | Kind | Mass % | Kind | Mass % |
| Pigment Dispersion 1 | PR254 | 13.5 | Resin 2 | 2 | Resin 5 | 2 | PGMEA | 82.5 |
| Pigment Dispersion 2 | PB15:6 | 13.5 | Resin 3 | 2 | Resin 6 | 2 | PGMEA | 82.5 |
| Pigment Dispersion 3 | PY139 | 14.8 | Resin 1 | 3 | Resin 5 | 2.2 | PGMEA | 80 |
| Pigment Dispersion 4 | PV23 | 14.8 | Resin 1 | 3 | Resin 5 | 2.2 | PGMEA | 80 |
| Pigment Dispersion 5 | PG36 | 14.8 | Resin 4 | 5.2 | | | PGMEA | 80 |

(Pigment)
PR254: C.I. Pigment Red 254
PB 15:6: C.I. Pigment Blue 15:6
PY139: C.I. Pigment Yellow 139
PV23: C.I. Pigment Violet 23
PG36: C.I. Pigment Green 36
(Resin)

In the following resins, a numerical value added to a main chain represents a molar ratio, and a numerical value added to a side chain represents the number of repeating units. As a crosslinking value of the resin 5, an ethylenically unsaturated bond value was calculated.

Resin 1: Disperbyk-111 (manufactured by BYK Chemie)

Resin 2: the following structure (Mw=7950, acid value=34 mgKOH/g)

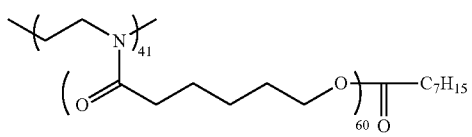

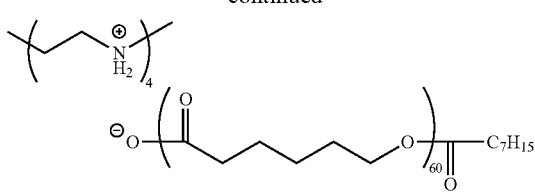

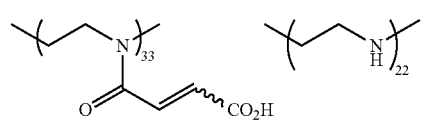

Resin 3: the following structure (Mw=30000, acid value=56 mgKOH/g)

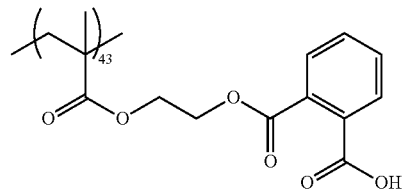

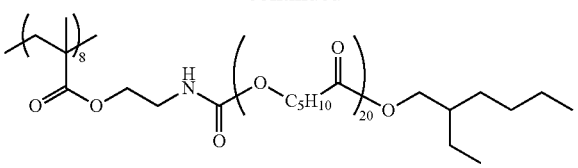

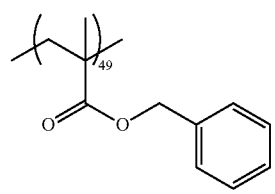

Resin 4: the following structure (Mw=24000, acid value=50 mgKOH/g)

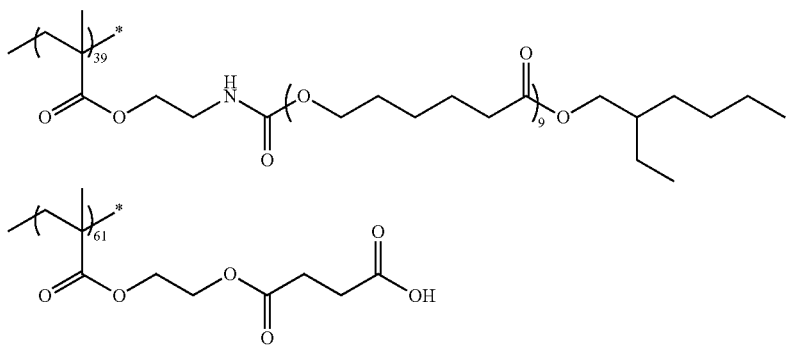

Resin 5: the following structure (Mw=12000, acid value=34 mgKOH/g, crosslinking value=1.4 mmol/g)

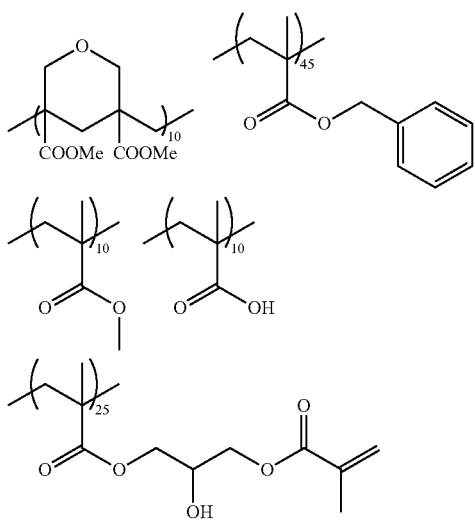

Resin 6: the following structure (Mw=19000, acid value=78 mgKOH/g)

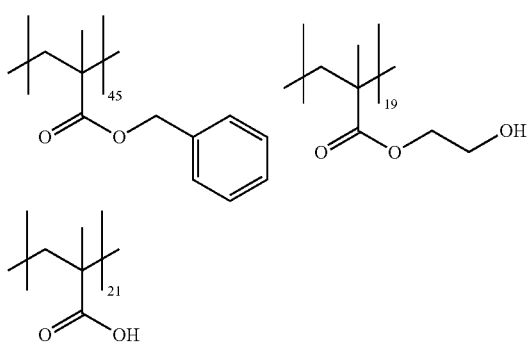

(Solvent)
PGMEA: propylene glycol monomethyl ether acetate

[Composition 1 for Forming Near Infrared Cut Filter]

| | |
|---|---|
| Infrared absorber Dispersion | 43.8 parts by mass |
| Resin 103 | 5.5 parts by mass |
| Polymerizable compound (ARONIX TO-2349, manufactured by Toagosei Co., Ltd.) | 3.2 parts by mass |
| Polymerizable compound (NK ESTER A-TMMT, manufactured by Shin-Nakamura Chemical Co., Ltd.) | 3.2 parts by mass |
| Photopolymerization Initiator 101 | 1 part by mass |
| Ultraviolet absorber (UV-503, manufactured by Daito Chemical Co., Ltd.) | 1.6 parts by mass |
| Surfactant 101 | 0.025 parts by mass |
| Polymerization inhibitor (p-methoxyphenol) | 0.003 parts by mass |
| Anti-coloring agent (ADEKA STAB AO-80 (manufactured by Adeka Corporation)) | 0.2 parts by mass |
| PGMEA | 41.47 parts by mass |

[Red Composition 1]

The following components were mixed and stirred, and the obtained mixture was filtered through a nylon filter (manufactured by Pall Corporation) having a pore size of 0.45 μm to prepare a Red composition.

| | |
|---|---|
| Red Pigment Dispersion | 51.7 parts by mass |
| Resin 104 (40 mass % PGMEA solution) | 0.6 parts by mass |
| Polymerizable compound 104 | 0.6 parts by mass |
| Photopolymerization Initiator 101 | 0.3 parts by mass |
| Surfactant 101 | 4.2 parts by mass |
| PGMEA | 42.6 parts by mass |

[Green Composition 1]

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Resin 104 (40 mass % PGMEA solution) | 0.3 parts by mass |
| Polymerizable compound 101 | 1.2 parts by mass |
| Photopolymerization Initiator 101 | 0.6 parts by mass |
| Surfactant 101 | 4.2 parts by mass |
| Ultraviolet absorber (UV-503, manufactured by Daito Chemical Co., Ltd.) | 0.5 parts by mass |
| PGMEA | 19.5 parts by mass |

[Blue Composition 1]

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Resin 104 (40 mass % PGMEA solution) | 2.1 parts by mass |

-continued

| | |
|---|---|
| Polymerizable compound 101 | 1.5 parts by mass |
| Polymerizable compound 104 | 0.7 parts by mass |
| Photopolymerization Initiator 101 | 0.8 parts by mass |
| Surfactant 101 | 4.2 parts by mass |
| PGMEA | 45.8 parts by mass |

Raw materials used in the Red composition 1, the Green composition 1, the Blue composition 1, and the composition 1 for forming a near infrared cut filter are as follows.

Infrared Absorber Dispersion 2.5 parts by mass of an infrared absorber A1, 0.5 parts by mass of a pigment derivative B1, 1.8 parts by mass of a dispersant C1, and 79.3 parts by mass of PGMEA were mixed with each other to obtain a mixed solution, 230 parts by mass of zirconia beads having a diameter of 0.3 mm was further added to the mixed solution, the solution was dispersed using a paint shaker for 5 hours, and the beads were separated by filtration. As a result, an infrared absorber dispersion was manufactured.

Infrared absorber A1: a compound (A1) having the following structure

Pigment derivative B1: a compound (B1) having the following structure

Dispersant C1: a resin (C1) having the following structure (Mw=20000, acid value=105 mgKOH/g; a numerical value added to a main chain represents a molar ratio, and a numerical value added to a side chain represents the number of repeating units)

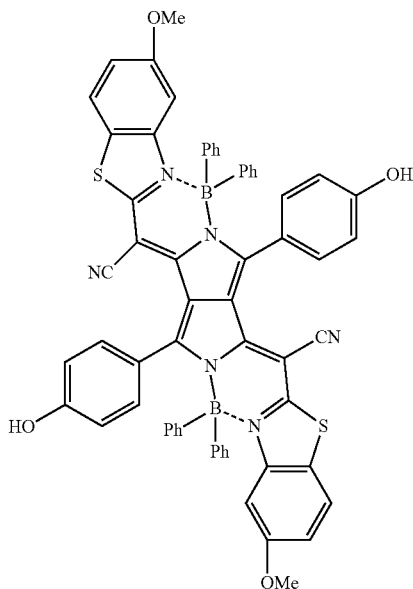

(A1)

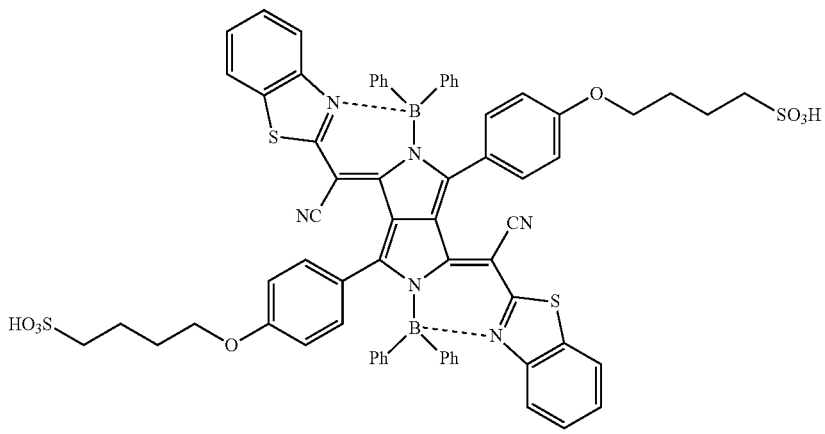

(B1)

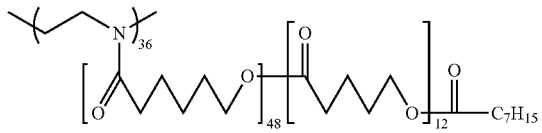
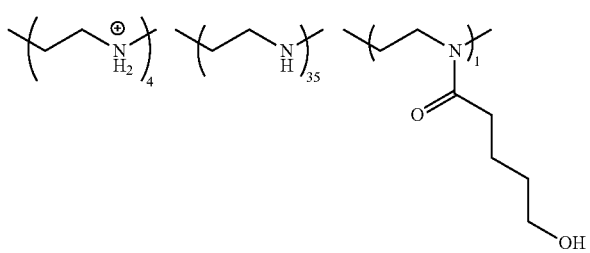

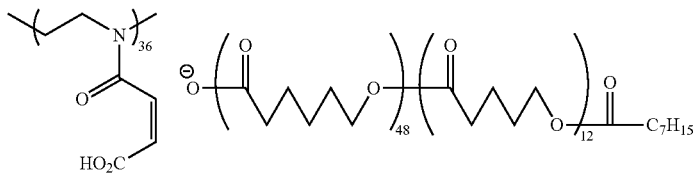

Red Pigment Dispersion 9.6 parts by mass of C.I. Pigment Red 254, 4.3 parts by mass of C.I. Pigment Yellow 139, 6.8 parts by mass of a dispersant (DISPERBYK-161, manufactured by BYK Chemie), and 79.3 parts by mass of PGMEA were mixed with each other to obtain a mixed solution, 230 parts by mass of zirconia beads having a diameter of 0.3 mm was added to the mixed solution, the solution was dispersed using a paint shaker for 3 hours, and the beads were separated by filtration. As a result, a Red pigment dispersion was manufactured.

Green Pigment Dispersion 6.4 parts by mass of C.I. Pigment Green 36, 5.3 parts by mass of C.I. Pigment Yellow 150, 5.2 parts by mass of a dispersant (DISPERBYK-161, manufactured by BYK Chemie), and 83.1 parts by mass of PGMEA were mixed with each other to obtain a mixed solution, 230 parts by mass of zirconia beads having a diameter of 0.3 mm was added to the mixed solution, the solution was dispersed using a paint shaker for 3 hours, and the beads were separated by filtration. As a result, a Green pigment dispersion was manufactured.

Blue Pigment Dispersion 9.7 parts by mass of C.I. Pigment Blue 15:6, 2.4 parts by mass of C.I. Pigment Violet 23, 5.5 parts by mass of a dispersant (DISPERBYK-161, manufactured by BYK Chemie), and 82.4 parts by mass of PGMEA were mixed with each other to obtain a mixed solution, 230 parts by mass of zirconia beads having a diameter of 0.3 mm was added to the mixed solution, the solution was dispersed using a paint shaker for 3 hours, and the beads were separated by filtration. As a result, a Blue pigment dispersion was manufactured.

Polymerizable Compound 101: KAYARAD DPHA (Manufactured by Nippon Kayaku Co., Ltd.)

Polymerizable Compound 104: the following structure

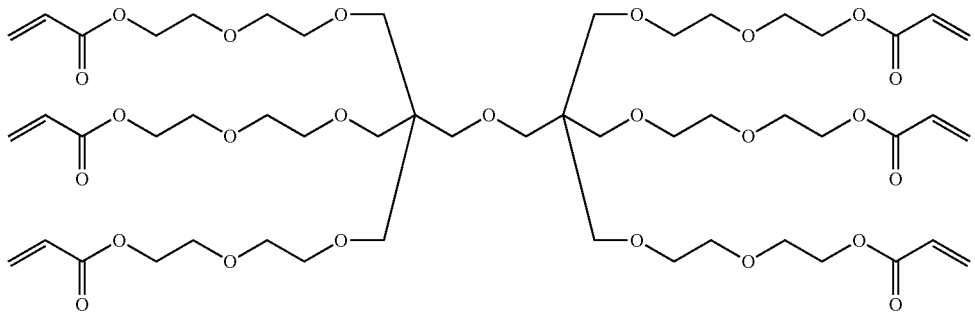 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Resin 103: a resin having the following structure (a numerical value added to a main chain represents a molar ratio; Mw=40000, acid value=100 mgKOH/g)

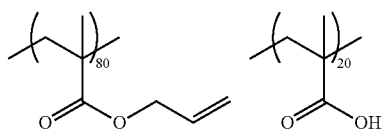

Resin 104: the following structure (Mw=11000; a numerical value added to a main chain represents a molar ratio)

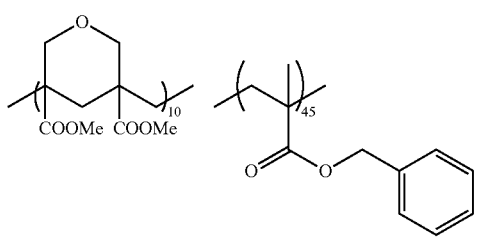

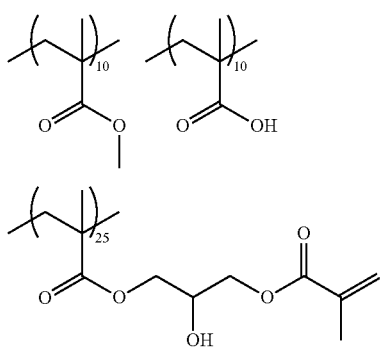

Photopolymerization Initiator 101: IRGACURE-OXE 01 (manufactured by BASF SE)

Surfactant 101: a 1 mass % PGMEA solution of the following mixture (Mw: 14000; in the following formula, "%" representing the proportion of a repeating unit is mass %)

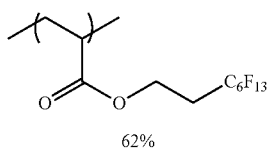

62%

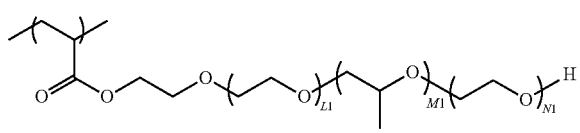

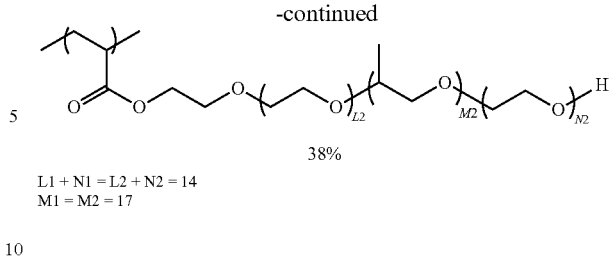

38%

L1 + N1 = L2 + N2 = 14
M1 = M2 = 17

Examples 201 to 210

Structures according to Examples 201 to 210 were manufactured using the same method as that of Example 101, except that compositions 101 to 110 for forming a near infrared transmitting filter shown below in Table 5 were used instead of the composition 1 for forming a near infrared transmitting filter used in Example 101. Each of the structures was incorporated into a solid image pickup element according to a well-known method to manufacture an infrared sensor. Regarding each of the infrared sensors, a subject was irradiated with light emitted from an infrared light emitting diode (infrared LED) light source in a low-illuminance environment (0.001 Lux) to acquire images. Next, the imaging performance of the solid image pickup element was evaluated. In the infrared sensors formed of the structures according to Examples 201 to 210, the subject was able to be recognized on the image more clearly than in the infrared sensor formed of the structure according to Comparative Example 101.

In addition, in each of Examples, the same effects as those of each of Examples were obtained even in a case where, during the formation of the near infrared transmitting filter, the near infrared cut filter, and the color filter, the silicon wafer was rinsed in a state where a nozzle that ejected a rinsing liquid during rinsing was moved from a silicon wafer center portion to a silicon wafer peripheral portion and the moving speed of the nozzle decreased toward the silicon wafer peripheral portion. In addition, the same effects as those of each of Examples were obtained even in a case where the silicon wafer was rinsed in a state where the moving speed of the nozzle decreased while moving the nozzle that ejected the rinsing liquid during rinsing was moved to the silicon wafer peripheral portion.

[Preparation of Dispersion]

Components shown below in Table 4 were mixed with each other, 230 parts by mass of zirconia beads having a diameter of 0.3 mm was further added to the mixture, and the solution was dispersed using a paint shaker for 5 hours. Next, the zirconia beads were separated by filtration. As a result, a dispersion was prepared.

TABLE 4

| | Colorant, Infrared Absorber | | Dispersing Auxiliary Agent (Pigment Derivative, Resin) | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Dispersion R-2 | PR254 PY139 | 8.3 3.7 | B1 | 2.3 | C2 | 4.4 | J1 | 81.30 |
| Dispersion Y-1 | PY139 | 11.00 | B1 | 1.59 | C2 | 4.4 | J1 | 83.01 |
| Dispersion Y-3 | Yellow Pigment 1 | 11.00 | B1 | 1.59 | C2 | 4.4 | J1 | 83.01 |
| Dispersion Y-4 | Yellow Pigment 2 | 11.00 | B1 | 1.59 | C2 | 4.4 | J1 | 83.01 |
| Dispersion Y-5 | Yellow Pigment 3 | 11.00 | B1 | 1.59 | C2 | 4.4 | J1 | 83.01 |
| Dispersion V-1 | PV23 | 14.20 | P1 | 2 | C2 | 3.8 | J1 J2 | 70.00 10.00 |

TABLE 4-continued

| | Colorant, Infrared Absorber | | Dispersing Auxiliary Agent (Pigment Derivative, Resin) | | Dispersant | | Solvent | |
|---|---|---|---|---|---|---|---|---|
| | Kind | Part(s) by Mass | Kind | Part(s) by Mass | Kind | Part(s) by Mass | Kind | Part(s) by Mass |
| Dispersion B-1 | PB15:6 | 12.59 | | | C2 | 4.4 | J1 | 83.01 |
| Dispersion B-2 | PB15:6 PV23 | 10.00 2.59 | | | C2 | 4.4 | J1 | 83.01 |
| Dispersion B-3 | PB16 | 12.59 | | | C2 | 4.4 | J1 | 83.01 |
| Dispersion Bk-1 | IB | 12.59 | | | C1 | 4.4 | J1 | 83.01 |
| Dispersion Bk-2 | PBk32 | 12.59 | | | C2 | 4.4 | J1 | 83.01 |
| Dispersion Bk-4 | IB PB15:6 | 11.3 3.75 | | | C4 | 5.63 | J1 | 79.32 |
| Dispersion IR-3 | K2 | 6.7 | K4 | 0.8 | C3 | 6 | J1 | 86.5 |

[Preparation of Compositions 101 to 110 for Forming Near Infrared Transmitting Filter]

The compositions 101 to 110 for forming a near infrared transmitting filter were prepared by mixing components shown below in Table 5. Numerical values in the table are represented by "part(s) by mass"

TABLE 5

| | | Composition 101 for forming Near Infrared Transmitting Filter | Composition 102 for forming Near Infrared Transmitting Filter | Composition 103 for forming Near Infrared Transmitting Filter | Composition 104 for forming Near Infrared Transmitting Filter | Composition 105 for forming Near Infrared Transmitting Filter | Composition 106 for forming Near Infrared Transmitting Filter | Composition 107 for forming Near Infrared Transmitting Filter | Composition 108 for forming Near Infrared Transmitting Filter | Composition 109 for forming Near Infrared Transmitting Filter | Composition 110 for forming Near Infrared Transmitting Filter |
|---|---|---|---|---|---|---|---|---|---|---|---|
| Dispersion | R-2 | 17.16 | | | | | | | | | |
| | Y-1 | 13.14 | 16.95 | 7.82 | | 30.83 | 16.81 | 16.81 | 16.81 | 41.60 | |
| | Y-3 | | | | | | | | | | |
| | Y-4 | | | | | | | | | | |
| | Y-5 | 7.68 | | | | | | | | | |
| | V-1 | 38.27 | | | | 12.11 | | 12.96 | 12.96 | 12.12 | |
| | B-1 | | 16.95 | 20.34 | | 31.70 | | | | | |
| | B-2 | | | | | | 44.29 | 44.29 | 44.29 | | |
| | B-3 | | | 54.77 | | | | | | 27.78 | |
| | Bk-1 | | 52.16 | | | | | | | | |
| | Bk-2 | | | | | | | | | | 77.95 |
| | Bk-4 | | | | 73.20 | | | | | | |
| | IR-3 | | | | | | | | | | 2.10 |
| Polymerizable Compound | D1 | 0.80 | 1.89 | | | 4.20 | 2.54 | 2.54 | 2.54 | 2.10 | |
| | D2 | 1.00 | | | | | | | | | |
| | D3 | 0.80 | | | | | | | | | |
| | D4 | | | | | | | | | | 1.25 |
| | D5 | | | 1.98 | | | | | | | |
| | D7 | | | | 2.56 | | | | | | |
| | D8 | | | | 2.56 | | | | | | 1.22 |
| | D9 | | | | 2.56 | | | | | | 0.784 |
| Photo-polymerization Initiator | I1 | | | | | | | | | | |
| | I2 | | 0.555 | 0.344 | | 0.500 | | | | 0.500 | |
| | I3 | 0.540 | | 0.340 | | | 0.876 | 0.876 | 0.876 | 0.500 | |
| | I4 | 0.400 | | | | | | | | | |
| | I6 | | | | 0.210 | | | | | | |
| Resin | P1 | 2.99 | 2.53 | 2.95 | | 2.05 | 3.41 | 3.41 | 3.41 | 2.5 | 1.403 |
| | P2 | | | | 5.7 | | | | | | |
| | P3 | | | | | | | | | | |
| Additive | L1 | | 0.1 | | | | | | | | 0.474 |
| | L2 | | 0.1 | | | | | | | | 0.158 |
| | L3 | | 0.1 | | | | | | | | |
| Polyfunctional Thiol | M1 | | | | | 0.2 | | | | | |
| Surfactant | F1 | 0.04 | 0.04 | 0.04 | 0.04 | 0.04 | 0.04 | 0.04 | 0.04 | 0.04 | 0.04 |
| Polymerization Inhibitor | G1 | 0.0013 | 0.0009 | 0.001 | 0.0013 | 0.0013 | 0.0013 | 0.0013 | 0.0013 | 0.0013 | 0.0013 |
| Solvent | J1 | 17.22 | 8.86 | 10.23 | 18.29 | 18.37 | 19.10 | 19.10 | 19.10 | 12.86 | 14.63 |
| | J4 | | | 1.23 | | | | | | | |

The raw materials shown above in Tables 4 and 5 are as follows.

(Colorant)
PR254: C.I. Pigment Red 254
PB 15:6: C.I. Pigment Blue 15:6
PB 16: C.I. Pigment Blue 16
PY139: C.I. Pigment Yellow 139
Yellow pigment 1: a sample 3 described in paragraph "0144" of JP2017-171914A
Yellow pigment 2: a sample 17 described in paragraph "0144" of JP2017-171914A
Yellow pigment 3: a sample 30 described in paragraph "0144" of JP2017-171914A
PV23: C.I. Pigment Violet 23
PBk 32: C.I. Pigment Black 32
IB: IRGAPHOR BLACK (manufactured by BASF SE)

(Infrared Absorber)
K2: a compound having the following structure (in the following structural formula, Me represents a methyl group, and Ph represents a phenyl group)

(Pigment Derivative)
B1, K4: a compound having the following structure (in the following structural formulae, Me represents an methyl group, and Ph represents a phenyl group)

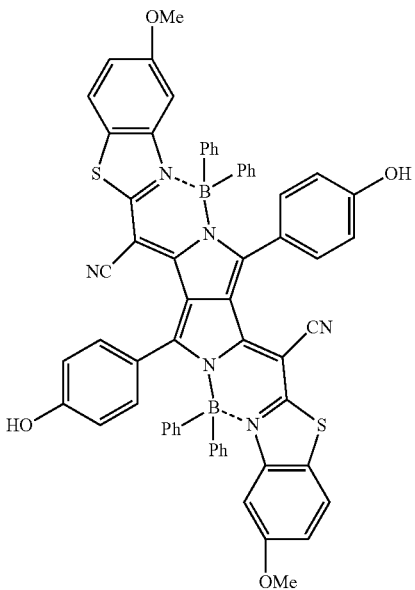

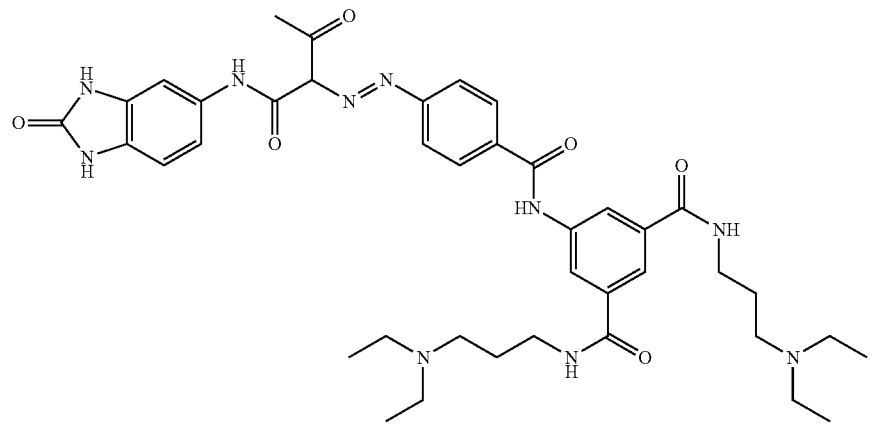

(B1)

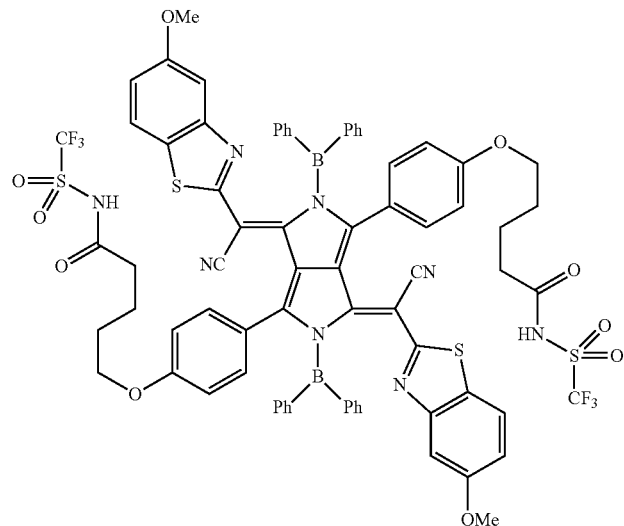

(K4)

(Dispersant)

C1: a resin having the following structure (a numerical value added to a main chain represents a molar ratio, and a numerical value added to a side chain represents the number of repeating units; Mw=20000)

C2: a resin having the following structure (a numerical value added to a main chain represents a molar ratio, and a numerical value added to a side chain represents the number of repeating units; Mw=26000)

C3: a resin having the following structure (a numerical value added to a main chain represents a molar ratio, and a numerical value added to a side chain represents the number of repeating units; Mw=21000)

C4: DISPERBYK 2000 (resin concentration: 40 mass %, manufactured by BYK Japan KK)

(C1)
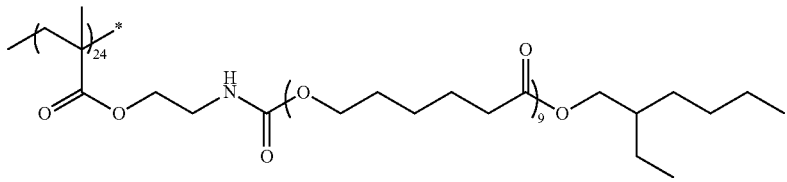

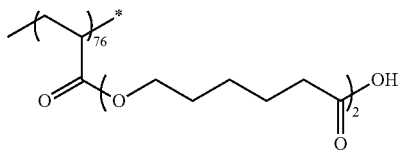

(C2)
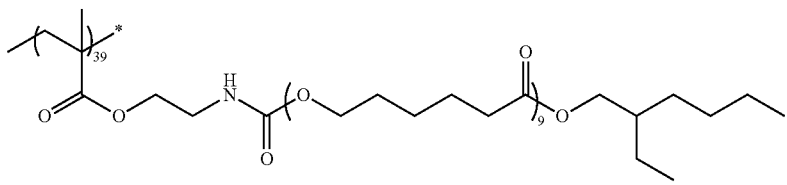

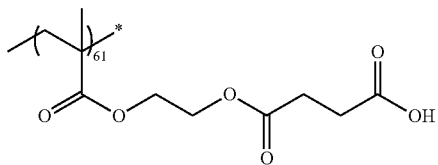

(C3)
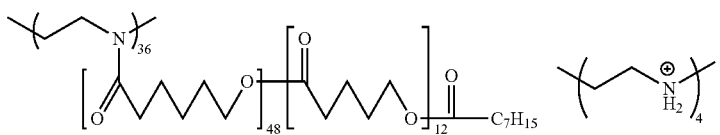

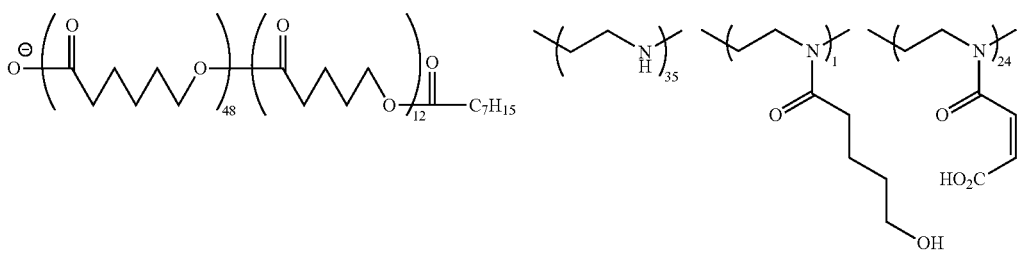

(Polymerizable Compound)
D1: a compound having the following structure (a+b+c=3)
D2: a compound having the following structure (a+b+c=4)
D3: a mixture of compounds having the following structures (compound in which a+b+c=5:compound in which a+b+c=6=3:1 (molar ratio))

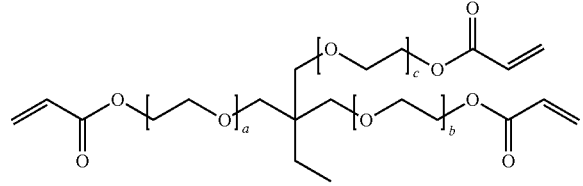

D4: a compound having the following structure

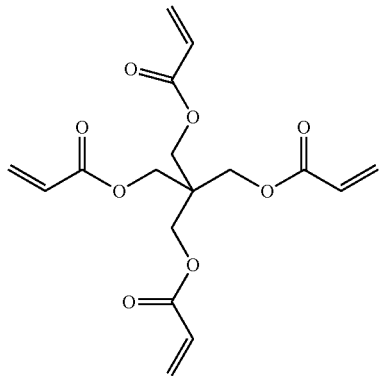 [SMILES: C=CC(=O)OCC(COC(=O)C=C)(COC(=O)C=C)COC(=O)C=C]

D5: a mixture of the following compounds (compound on the left side:compound on the right side=7:3 (mass ratio))

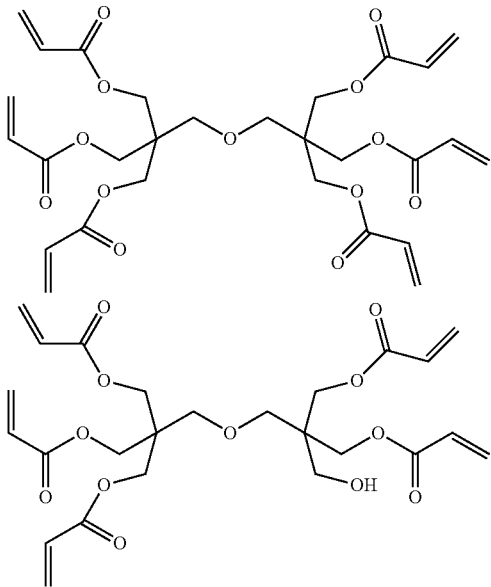

D7: ARONIX M-520 (manufactured by Toagosei Co., Ltd.)

D8: a compound having the following structure

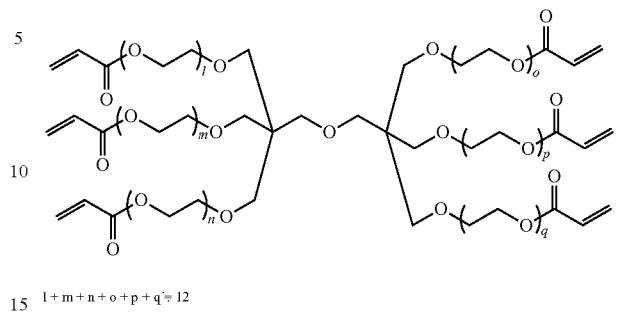

l + m + n + o + p + q = 12

D9: a mixture of compounds having the following structures (compound on the left side:compound in the middle:compound on the right side=44:16:40 (area ratio of high speed liquid chromatography))

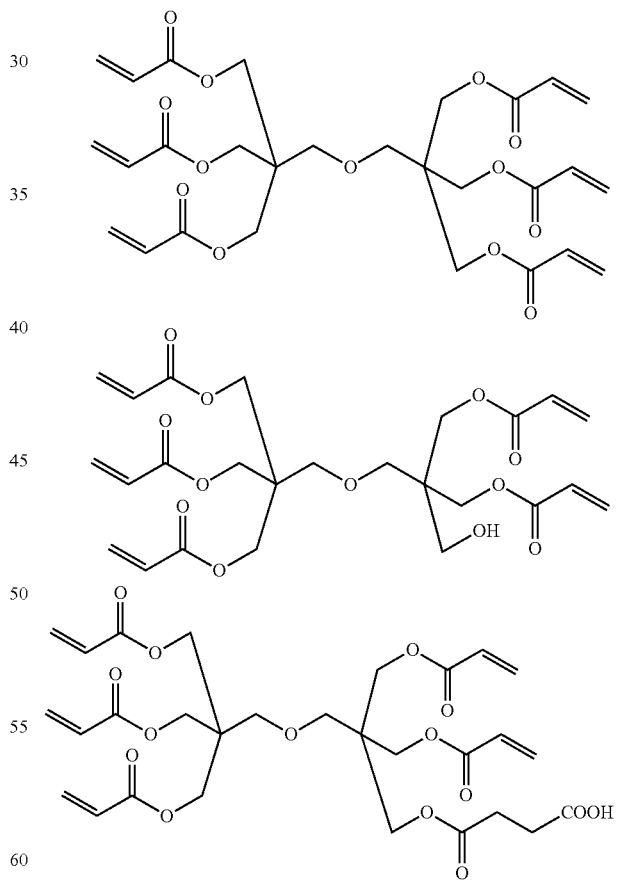

(Photopolymerization Initiator)
I1 to I4: compounds having the following structures
I6: ADEKAARKLS NCI-831 (manufactured by Adeka Corporation), (I1)

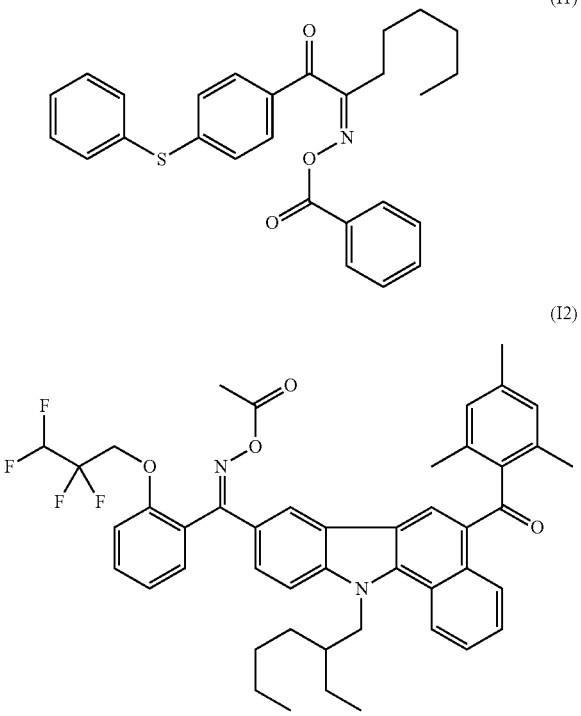

(I2)

(I3)

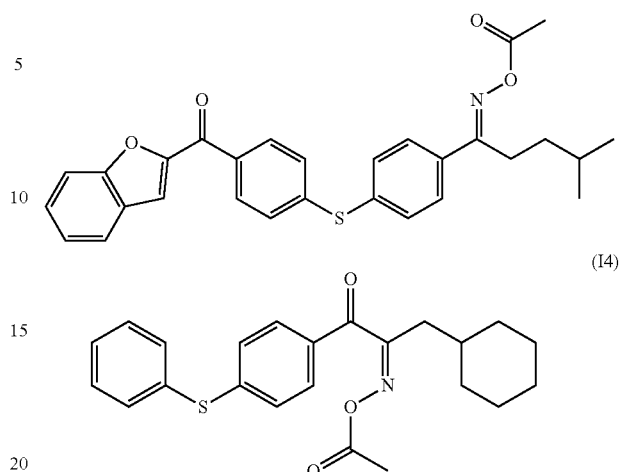

(I4)

(Resin)
P1: a resin having the following structure (a numerical value added to a main chain represents a molar ratio; Mw=11000)
P2: a resin having the following structure (Mw=4400, acid value=95 mgKOH/g; in the following structural formula, M represents a phenyl group, and A represents biphenyltetracarboxylic dianhydride residue)
P3: ACA250 (resin concentration: 45 mass %, manufactured by Daicel Corporation)

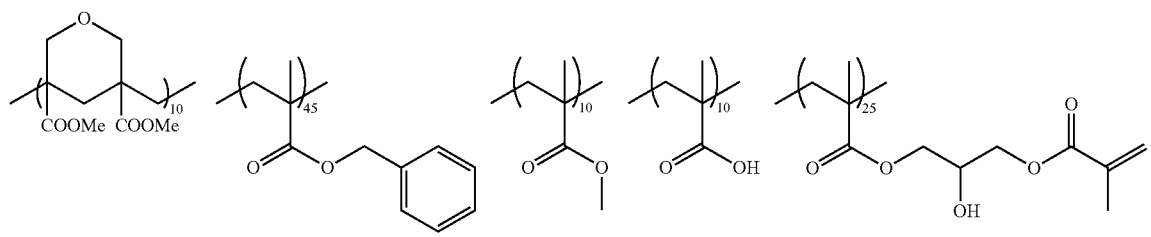

(P1)

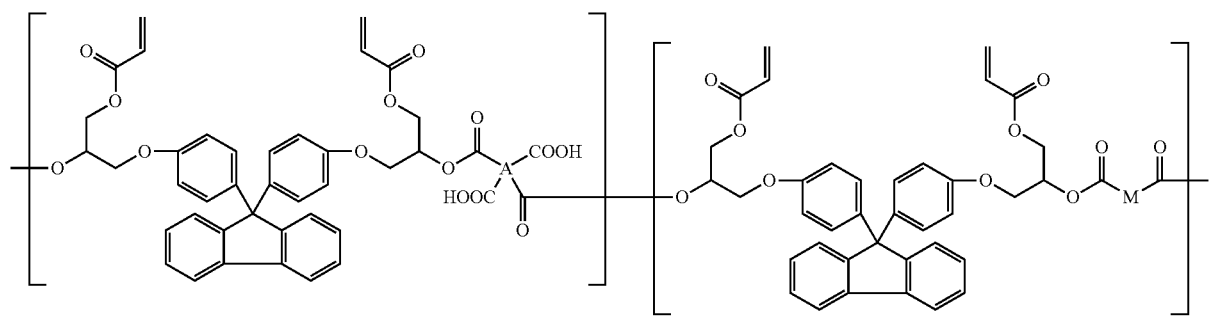

(P2)

(Polyfunctional Thiol)
M1: trimethylolpropane tris(3-mercaptobutyrate)
(Additives)
L1 to L3: compounds having the following structures

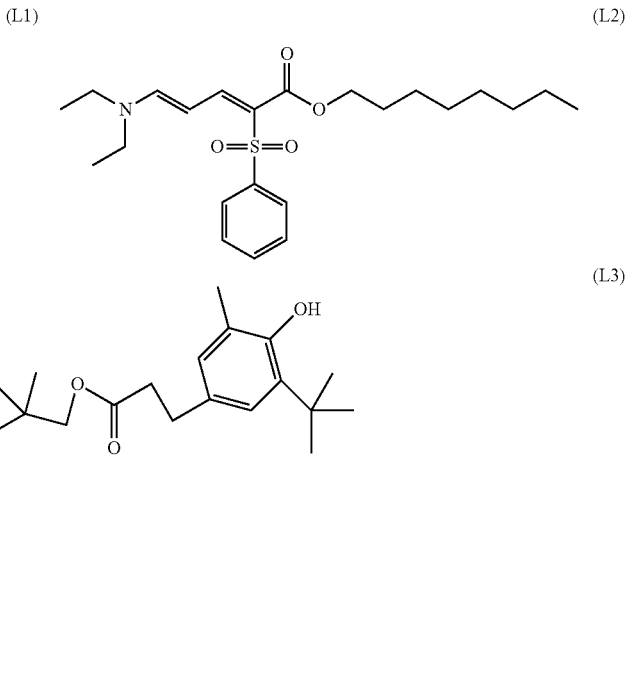

(Surfactant)
F1: the following mixture (Mw=14000, in the following formula, "%" representing the proportion of a repeating unit is mol %)

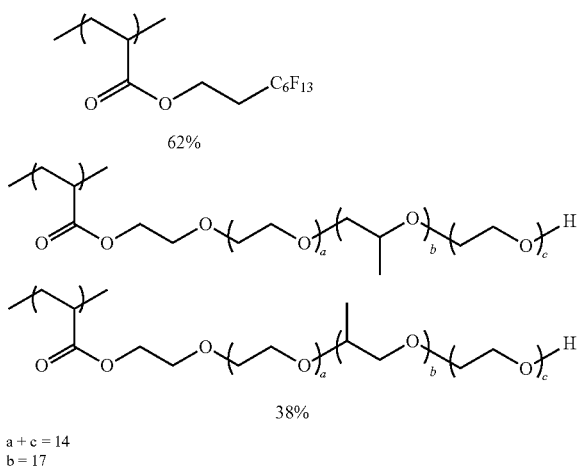

a + c = 14
b = 17

(Polymerization Inhibitor)
G1: p-methoxyphenol
(Solvent)
J1: propylene glycol monomethyl ether acetate (PGMEA)
J2: cyclohexanone
J4: 3-butoxy-N,N-dimethylpropanamide Example 301

A structures according to Example 301 was manufactured using the same method as that of Example 101, except that a near infrared transmitting filter including a laminate in which a film having a thickness of 0.85 μm formed of the Red composition 1 and a film having a thickness of 0.85 μm formed of the Blue composition 1 were laminated by sequentially applying the Red composition 1 and the Blue composition 1 was used instead of forming the near infrared transmitting filter using the composition 1 for forming a near infrared transmitting filter. Each of the structures was incorporated into a solid image pickup element according to a well-known method to manufacture an infrared sensor. Regarding this infrared sensor, a subject was irradiated with light emitted from an infrared light emitting diode (infrared LED) light source in a low-illuminance environment (0.001 Lux) to acquire images. Next, the imaging performance of the solid image pickup element was evaluated. In the infrared sensors formed of the structure according to Example 301, the subject was able to be recognized on the image more clearly than in the infrared sensor formed of the structure according to Comparative Example 101.

Examples 1001 to 1040

An optical waveguide represented by reference numeral 36 illustrated in FIG. 1 of JP2005-259824A was formed using each of the compositions according to Examples 1 to 40, and a solid image pickup element illustrated in FIG. 1 of JP2005-259824A was manufactured. This solid image pickup element was able to guide near infrared light with little loss.

EXPLANATION OF REFERENCES

1: core portion
2: cladding portion 10, 20: structure
11, 21: support
12, 23: near infrared transmitting filter
13, 24: microlens
22: optical waveguide
100, 200: structure
110, 210: support
111, 211: near infrared cut filter
112, 212: color filter
114, 214: near infrared transmitting filter
116, 216: planarizing layer
120, 121, 220, 221: microlens
230, 231: optical waveguide
hv: incidence ray

What is claimed is:

1. A structure comprising:
a near infrared transmitting filter that shields light in a visible range and allows transmission of at least a part of light in a near infrared range; and
a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range,
wherein the member is for a concave lens or a convex lens,
the member allows transmission of at least light having a wavelength of 810 nm and has a refractive index of 1.7 or higher for light having a wavelength of 810 nm,
the member includes particles formed of one or more of the group of Ge, $\varepsilon Fe_2O_3$, BaFe, SrFe, a phthalocyanine compound, and a naphthalocyanine compound, and
the near infrared transmitting filter is a filter that allows transmission of at least light having a wavelength of 810 nm.

2. The structure according to claim 1,
wherein the near infrared transmitting filter is a filter that allows transmission of at least a part of light in a wavelength range of 800 nm to 2000 nm.

3. The structure according to claim 1,
wherein the near infrared transmitting filter is a filter that allows transmission of at least light having a wavelength of 940 nm, and
the member allows transmission of at least light having a wavelength of 940 um and has a refractive index of 1.7 or higher for light having a wavelength of 940 nm.

4. The structure according to claim 1,
wherein the near infrared transmitting filter is a filter that allows transmission of at least light having a wavelength of 850 nm, and
the member allows transmission of at least light having a wavelength of 850 um and has a refractive index of 1.7 or higher for light having a wavelength of 850 nm.

5. The structure according to claim 1,
wherein in the member, B/A which is a ratio of a maximum value B of an absorbance in a wavelength range of 400 nm or longer and shorter than 800 nm to a maximum value A of an absorbance in a wavelength range of 800 nm to 2000 nm is 1.0 or higher.

6. The structure according to claim 1,
wherein the member is provided on the incidence side of the near infrared transmitting filter.

7. The structure according to claim 1,
wherein the particles are formed of the phthalocyanine compound.

8. The structure according to claim 1,
wherein the member further includes a resin.

9. The structure according to claim 1, further comprising:
a color filter that includes a chromatic colorant.

10. A solid image pickup element comprising:
the structure according to claim 1.

11. An infrared sensor comprising:
the structure according to claim 1.

12. A structure comprising:
a near infrared transmitting filter that shields light in a visible range and allows transmission of at least a part of light in a near infrared range; and
a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range,
wherein the member is for a concave lens or a convex lens,
the member allows transmission of at least light having a wavelength of 940 nm and has a refractive index of 1.7 or higher for light having a wavelength of 940 nm,
the member includes particles formed of one or more of the group of Ge, $\varepsilon Fe_2O_3$, BaFe, SrFe, a phthalocyanine compound, and a naphthalocyanine compound, and
the near infrared transmitting filter is a filter that allows transmission of at least light having a wavelength of 940 nm.

13. A structure comprising:
a near infrared transmitting filter that shields light in a visible range and allows transmission of at least a part of light in a near infrared range; and
a member that is provided on an optical path of the near infrared transmitting filter on at least one of an incidence side into the near infrared transmitting filter or an emission side from the near infrared transmitting filter, allows transmission of light in a near infrared range, and has a refractive index of 1.7 or higher for the light in the near infrared range,
wherein the member is for a concave lens or a convex lens, and
the member includes particles formed of a phthalocyanine compound.

* * * * *